(12) United States Patent
Kobayashi et al.

(10) Patent No.: US 11,369,959 B2
(45) Date of Patent: Jun. 28, 2022

(54) FLUIDIC DEVICE

(71) Applicant: NIKON CORPORATION, Tokyo (JP)

(72) Inventors: Ryo Kobayashi, Kawasaki (JP); Naoya Ishizawa, Saitama (JP); Taro Ueno, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 199 days.

(21) Appl. No.: 16/771,174

(22) PCT Filed: Dec. 13, 2017

(86) PCT No.: PCT/JP2017/044792
§ 371 (c)(1),
(2) Date: Jun. 9, 2020

(87) PCT Pub. No.: WO2019/116476
PCT Pub. Date: Jun. 20, 2019

(65) Prior Publication Data
US 2021/0162405 A1    Jun. 3, 2021

(51) Int. Cl.
*B01L 3/00* (2006.01)
*G01N 35/08* (2006.01)

(52) U.S. Cl.
CPC .......... *B01L 3/50273* (2013.01); *G01N 35/08* (2013.01); *B01L 2200/16* (2013.01);
(Continued)

(58) Field of Classification Search
CPC .............. B01J 19/00; B01L 2200/0684; B01L 2200/16; B01L 2300/0816;
(Continued)

(56) References Cited

U.S. PATENT DOCUMENTS

2002/0176805 A1    11/2002    Han-Oh et al.
2005/0048540 A1    3/2005    Inami et al.
(Continued)

FOREIGN PATENT DOCUMENTS

EP    1 254 702 A2    11/2002
EP    2 209 008 A1    7/2010
(Continued)

OTHER PUBLICATIONS

Aoki JP2007237021A, translation of foreing document (Year: 2007).*
(Continued)

*Primary Examiner* — Jennifer Wecker
*Assistant Examiner* — Jonathan Bortoli
(74) *Attorney, Agent, or Firm* — Squire Patton Boggs (US) LLP

(57) ABSTRACT

The present invention aims at providing a fluidic device that can hold a large amount of solutions in a reservoir without depending on an attitude. The reservoir includes a meandering flow path including: a plurality of first flow paths that extend linearly along a first direction and that are arranged to be spaced in a second direction crossing the first direction; and a second flow path that extends linearly along the second direction such that a connection between first end sides of the adjacent first flow paths and a connection between second end sides of the adjacent first flow paths are alternately switched along the second direction for each first flow path, wherein the meandering flow path meanders along the second direction. When the length of each of the first flow path and the second flow path is L, a surface tension is γ, the density of the solution is ρ, the acceleration which includes a gravity and which is applied to the solution is G, the wetted perimeter length of the first flow path and the second flow path is Wp, a cross-sectional area of the first flow path and the second flow path is A, a receding contact angle is α, and
(Continued)

an advancing contact angle is $\beta$, a relationship $L \leq (\gamma \times Wp \times (\cos \alpha - \cos \beta))/(\rho \times A \times G)$ is satisfied.

20 Claims, 17 Drawing Sheets

(52) U.S. Cl.
CPC .............. *B01L 2300/0816* (2013.01); *B01L 2300/0883* (2013.01); *B01L 2400/0406* (2013.01); *B01L 2400/0475* (2013.01); *B01L 2400/0622* (2013.01)

(58) Field of Classification Search
CPC ..... B01L 2300/0883; B01L 2300/0887; B01L 2400/0406; B01L 2400/0475; B01L 2400/0481; B01L 2400/0622; B01L 2400/0655; B01L 3/50273; B01L 3/502738; B81B 1/00; G01N 2035/1034; G01N 35/08; G01N 35/10; G01N 37/00
See application file for complete search history.

(56) References Cited

U.S. PATENT DOCUMENTS

2007/0243111 A1* 10/2007 Momose ............ F16K 99/0017
422/400

2010/0221741 A1 9/2010 Saiki et al.
2017/0370922 A1 12/2017 Ichiki et al.

FOREIGN PATENT DOCUMENTS

| EP | 3 276 357 A1 | | 1/2018 | |
|---|---|---|---|---|
| JP | 2003-021640 A | | 1/2003 | |
| JP | 2005-065607 A | | 3/2005 | |
| JP | 2007237021 A | * | 9/2007 | |
| JP | 2007-285792 A | | 11/2007 | |
| JP | 2009-092391 A | | 4/2009 | |
| WO | 2016/153006 A1 | | 9/2016 | |
| WO | WO-2016153006 A1 | * | 9/2016 | .......... B01F 13/0059 |

OTHER PUBLICATIONS

Hirofumi WO-2016153006, translation of foreing docuement (Year: 2016).*
International Search Report corresponding to International Patent Application No. PCT/JP2017/044792, dated Mar. 6, 2018.
Written Opinion corresponding to International Patent Application No. PCT/JP2017/044792, dated Mar. 20, 2018.
Jong Wook Hong, et al., "A nanoliter-scale nucleic acid processor with parallel architecture", Nature Biotechnology, vol. 22, No. 4, Apr. 2004, pp. 435-439.
Notice of Reasons For Rejection dated Nov. 2, 2021 for Japanese Patent Application No. 2019-559474, with English translation, 7 pages.

* cited by examiner

FLUIDIC DEVICE

TECHNICAL FIELD

The invention relates to a fluidic device.

BACKGROUND

In recent years, development of μ-TAS (Micro-Total Analysis Systems) aiming at an increase in speed, an increase in efficiency, and an increase in the degree of integration of tests in the field of in-vitro diagnosis, or microminiaturization of test equipment has attracted attention, and active researches thereof have been conducted worldwide.

μ-TAS are more excellent than test equipment in the related art in that μ-TAS can perform measurements and analyses with a small amount of sample, are portable, are disposable at a low cost, and the like.

Further, attention have been attracted as a method having high usefulness when an expensive reagent is used or when a small amount of and a large number of samples are tested.

A device that includes a flow path and a pump arranged on the flow path has been reported as a component of μ-TAS (Non-Patent Document 1). In such a device, a plurality of solutions are mixed in the flow path by injecting the plurality of solutions into the flow path and activating the pump.

RELATED ART DOCUMENTS

Patent Document

[Patent Document 1]
Japanese Unexamined Patent Application, First Publication No. 2005-65607
[Non-Patent Document 1]
Jong Wook Hong, Vincent Studer, Giao Hang, W French Anderson and Stephen R Quake, Nature Biotechnology 22, 435-439 (2004)

SUMMARY OF INVENTION

According to a first aspect of the present invention, there is provided a fluidic device including: a flow path into which a solution is introduced; and a reservoir in which the solution is accommodated, which has a length in a direction in which the solution flows, the length being larger than a width perpendicular to the length, and which is configured to supply the solution to the flow path, wherein the reservoir includes a meandering flow path including: a plurality of first flow paths that extend linearly along a first direction and that are arranged to be spaced in a second direction crossing the first direction; and a second flow path that extends linearly along the second direction such that a connection between first end sides of the adjacent first flow paths and a connection between second end sides of the adjacent first flow paths are alternately switched along the second direction for each first flow path, the meandering flow path meandering along the second direction, and wherein, when the length of each of the first flow path and the second flow path is L (m), a surface tension is γ(N/m), a density of the solution is ρ(kg/m$^3$), an acceleration which includes a gravity and which is applied to the solution is G (m/s$^2$), a wetted perimeter length of the first flow path and the second flow path is Wp (m), a cross-sectional area of the first flow path and the second flow path is A (m$^2$), a receding contact angle is α (°), and an advancing contact angle is β (°), a relationship $L \leq (\gamma \times Wp \times (\cos \alpha - \cos \beta))/(\rho \times A \times G)$ is satisfied.

According to a second aspect of the present invention, there is provided a fluidic device including: a flow path into which a solution is introduced; and a reservoir in which the solution is accommodated, which has a length in a direction in which the solution flows, the length being larger than a width perpendicular to the length, and which is configured to supply the solution to the flow path, wherein the reservoir is provided on a substrate and includes a detour flow path that is formed in a flow path length longer than a distance between a first penetration hole and a second penetration hole which penetrate through the substrate in a thickness direction perpendicular to the length and the width, the detour flow path detouring and connecting together the first penetration hole and the second penetration hole, and wherein, when the distance between the first penetration hole and the second penetration hole is L (m), a surface tension is γ (N/m), a density of the solution is ρ (kg/m$^3$), an acceleration which includes a gravity and which is applied to the solution is G (m/s$^2$), a wetted perimeter length of the detour flow path is Wp (m), a cross-sectional area of the detour flow path is A (m$^2$), a receding contact angle is α (°), and an advancing contact angle is β (°), a relationship $L \leq (\gamma \times Wp \times (\cos \alpha - \cos \beta))/(\rho \times A \times G)$ is satisfied.

According to a third aspect of the present invention, there is provided a fluidic device including: a flow path into which a solution is introduced; and a reservoir in which the solution is accommodated, which has a length in a direction in which the solution flows, the length being larger than a width perpendicular to the length, and which is configured to supply the solution to the flow path, wherein the reservoir is provided on a substrate and includes a detour flow path that is formed in a flow path length longer than the distance between a first penetration hole and a second penetration hole which penetrate through the substrate in a thickness direction perpendicular to the length and the width, the detour flow path detouring and connecting together the first penetration hole and the second penetration hole, and wherein, when the distance between an interface of the accommodated solution on the first penetration hole side and an interface of the accommodated solution on the second penetration hole side is L(m), a surface tension is γ (N/m), the density of the solution is ρ (kg/m$^3$), an acceleration which includes a gravity and which is applied to the solution is G (m/s$^2$), the wetted perimeter length of the detour flow path is Wp (m), a cross-sectional area of the detour flow path is A (m$^2$), a receding contact angle is α (°), and an advancing contact angle is β (°), a relationship $L \leq (\gamma \times Wp \times (\cos \alpha - \cos \beta))/(\rho \times A \times G)$ is satisfied.

DESCRIPTION OF EMBODIMENTS

Figure 1:
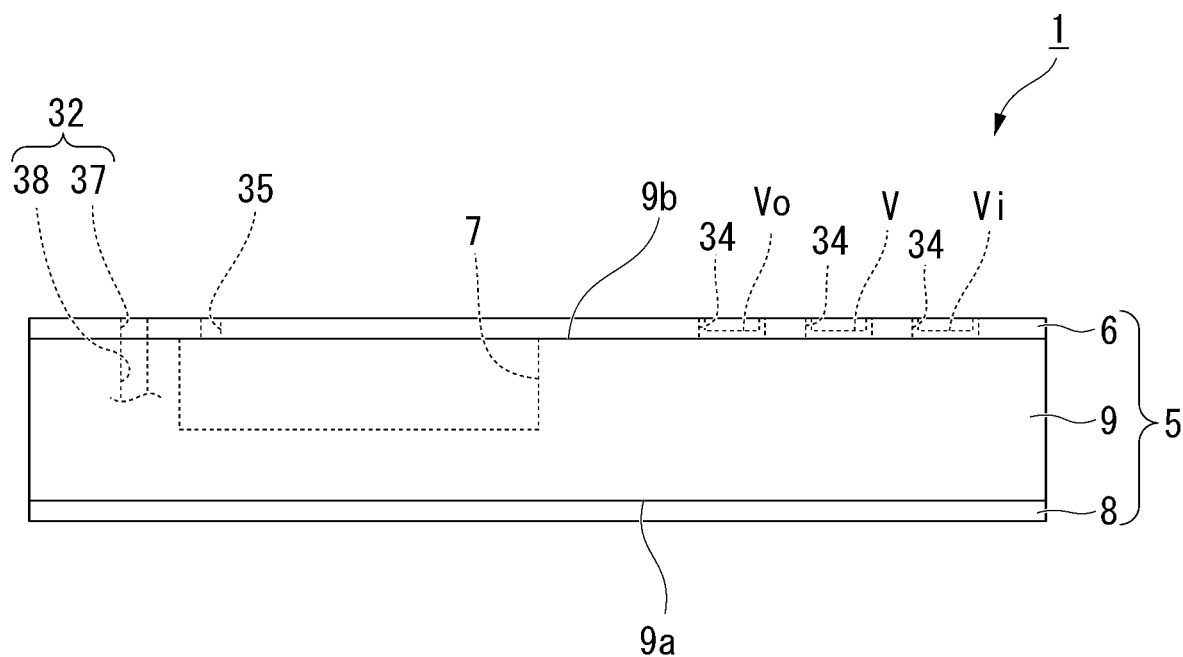
FIG. 1 is a front view of a fluidic device according to an embodiment.

Hereinafter, an embodiment of a fluidic device is described with reference to FIG. 1 to FIG. 19. In the drawings used in the following description, featured parts may be enlarged for the purpose of convenience in order to facilitate understanding of features, and dimensional ratios of components or the like may be not the same as actual ones.

First Embodiment of Fluidic Device

Figure 2:
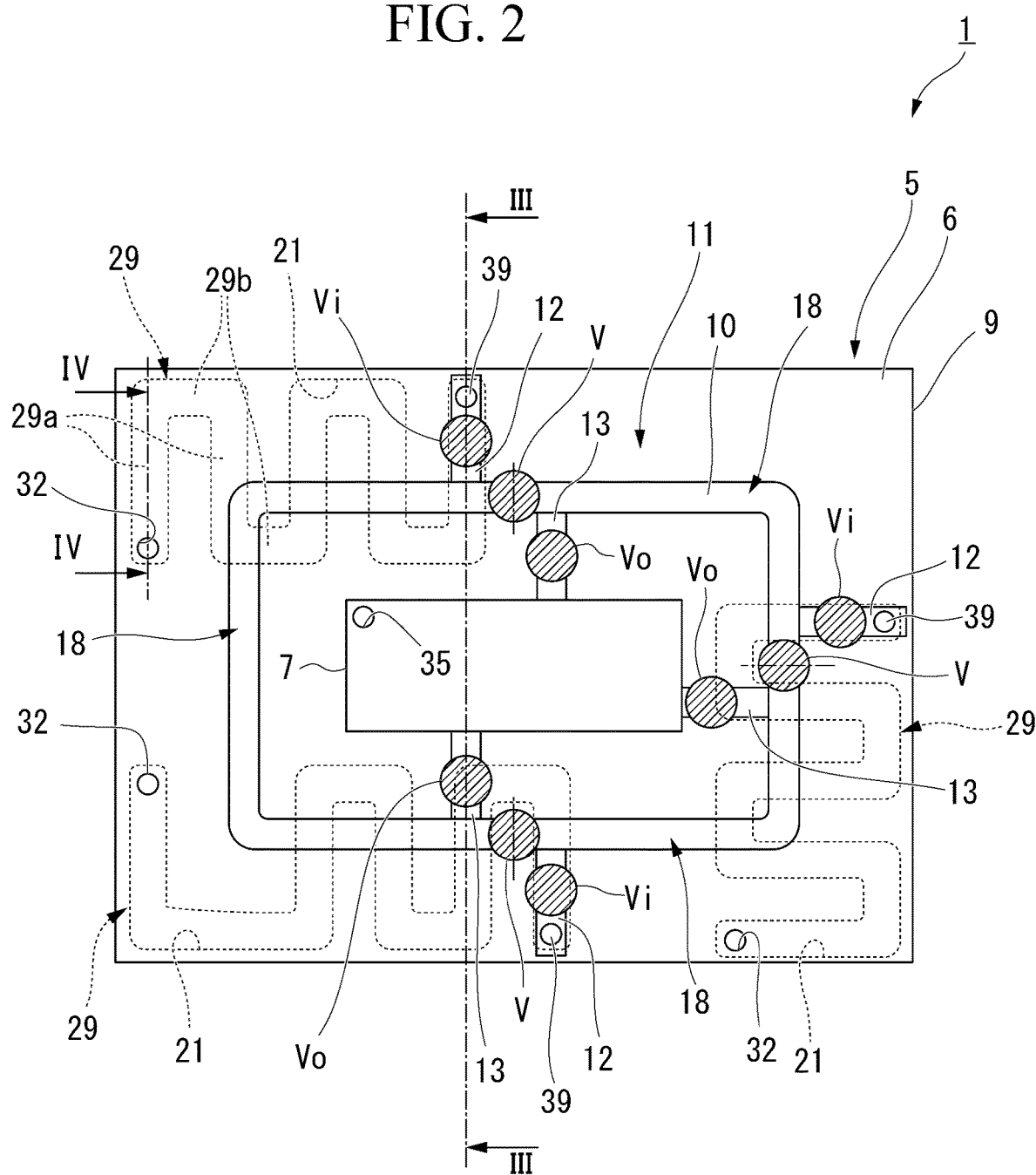
FIG. 2 is a plan view schematically showing the fluidic device according to the embodiment.

FIG. 1 is a front view of a fluidic device 1 according to an embodiment. FIG. 2 is a plan view schematically showing the fluidic device 1. In FIG. 2, a transparent upper plate 6 is shown in a state where each portion arranged on a lower side is made transparent.

The fluidic device 1 according to the present embodiment includes a device that detects a sample material as a detection target included in a sample by an immune reaction, an enzyme reaction, or the like. Examples of the sample material include biomolecules such as nucleic acid, DNA, RNA, peptides, proteins, and extracellular endoplasmic reticula.

As shown in FIG. 2, the fluidic device 1 includes a base material 5 and a plurality of valves V, Vi, and Vo.

As shown in FIG. 1, the base material 5 includes an upper plate (second substrate) 6, a lower plate (third substrate) 8, and a substrate 9. The upper plate 6, the lower plate 8, and the substrate 9 of the present embodiment are constituted of a resin material. Examples of the resin material that constitutes the upper plate 6, the lower plate 8, and the substrate 9 include polypropylene, polycarbonate, and the like. In the present embodiment, the upper plate 6 and the lower plate 8 are constituted of a transparent material. The material that constitutes the upper plate 6, the lower plate 8, and the substrate 9 are not limited.

The following embodiment is described using an example in which the upper plate (for example, a lid part, an upper part or a lower part of a flow path, or an upper surface or a bottom surface of a flow path) 6, the lower plate (for example, a lid part, an upper part or a lower part of a flow path, or an upper surface or a bottom surface of a flow path) 8, and the substrate 9 are arranged along a horizontal plane, the upper plate 6 is arranged on an upper side of the substrate 9, and the lower plate 8 is arranged on a lower side of the substrate 9. However, this is merely for defining a horizontal direction and a vertical direction for the purpose of convenience of explanation and does not limit the direction at the time of use of the fluidic device 1 according to the present embodiment.

The upper plate 6, the substrate 9 and the lower plate 8 are a plate material that extends along the horizontal direction. The upper plate 6, the substrate 9 and the lower plate 8 are laminated in this order along the vertical direction. The substrate 9 is laminated on the upper plate 6 at a lower side of the upper plate 6. The lower plate 8 is laminated on the substrate 9 at a surface (a lower surface 9a) on the opposite side of the upper plate 6. The base material 5 is manufactured by joining together and integrating the upper plate 6, the lower plate 8, and the substrate 9 by a joint means such as bonding.

In the following description, a direction in which the upper plate 6, the substrate 9, and the lower plate 8 are laminated is simply referred to as a lamination direction. In the present embodiment, the lamination direction is the vertical direction.

As shown in FIG. 1, a penetration hole 37, an air hole 35, and a plurality of valve holding holes 34 are provided on the upper plate 6. The penetration hole 37, the air hole 35, and the valve holding hole 34 penetrate through the upper plate 6 in a plate thickness direction.

The penetration hole 37 is located directly above a penetration hole (first penetration hole) 38 of the substrate 9 and is connected to the penetration hole 38 as described below. That is, when seen from the lamination direction, the penetration hole 37 and the penetration hole 38 overlap with each other. The penetration hole 37 and the penetration hole 38 constitute an injection hole 32. The penetration hole 37 constitutes an opening of the injection hole 32. That is, the opening of the injection hole 32 is located in the upper plate 6.

The air hole 35 is located directly above a waste solution tank 7 in upper plate 6. The air hole 35 connects the waste solution tank 7 to the outside. As described later, a suction device (negative pressure applying device) 56 can be connected to the air hole 35.

The valve holding hole 34 holds valves V, Vi, and Vo. The valves V, Vi, and Vo are formed such that a flow path 11 provided between the upper plate 6 and the substrate 9 can be blocked.

Figure 3:
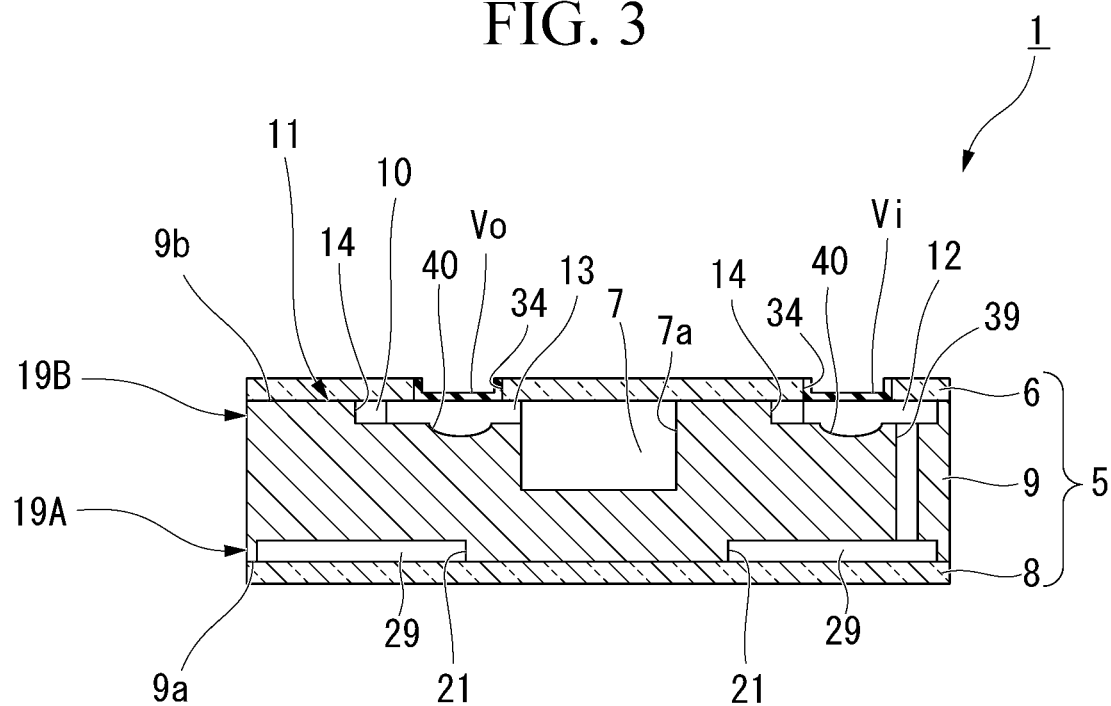
FIG. 3 is a cross-sectional view along a III-III line in FIG. 2.

FIG. 3 is a cross-sectional view of the fluidic device 1 along a III-III line in FIG. 2.

As shown in FIG. 3, the substrate 9 has an upper surface (first surface) 9b and a lower surface (second surface) 9a. The upper plate 6 is located on the upper surface 9b side of the substrate 9. The lower plate 8 is located on the lower surface 9a side of the substrate 9.

The substrate 9 includes a reservoir layer 19A on the lower surface 9a side. A plurality of reservoirs 29 are provided in the reservoir layer 19A. The substrate 9 includes a reaction layer 19B on the upper surface 9b side. The flow path 11 and the waste solution tank 7 are provided in the reaction layer 19B.

As shown in FIG. 2, when seen from the lamination direction, at least part of the flow path 11 and at least part of the reservoir 29 are arranged to overlap with each other. According to the present embodiment, the flow path 11 and the reservoir 29 are arranged on the upper surface 9b side and the lower surface 9a side of the substrate 9, respectively, and thereby, the flow path 11 and the reservoir 29 can be arranged to overlap with each other when seen from the lamination direction. Thereby, it is possible to reduce the size of the fluidic device 1.

The penetration hole 38A and a supply hole (second penetration hole) 39 that penetrates in the vertical direction are provided in the substrate 9. The supply hole 39 connects the reservoir 29 to the flow path 11. A solution stored in the reservoir 29 is supplied to the flow path 11 via the supply hole 39.

Figure 4:
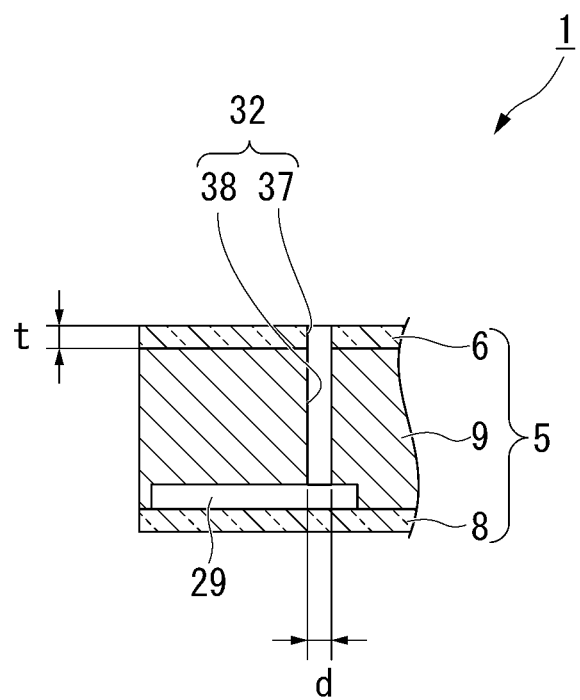
FIG. 4 is a cross-sectional view along a IV-IV line in FIG. 2.

FIG. 4 is a cross-sectional view of the fluidic device 1 along a IV-IV line in FIG. 2.

The penetration hole 38 connects to the penetration hole 37 of the upper plate 6 and constitutes the injection hole 32. The injection hole 32 connects the reservoir 29 to the outside. The solution is filled into the reservoir 29 via the injection hole 32.

Figure 5:
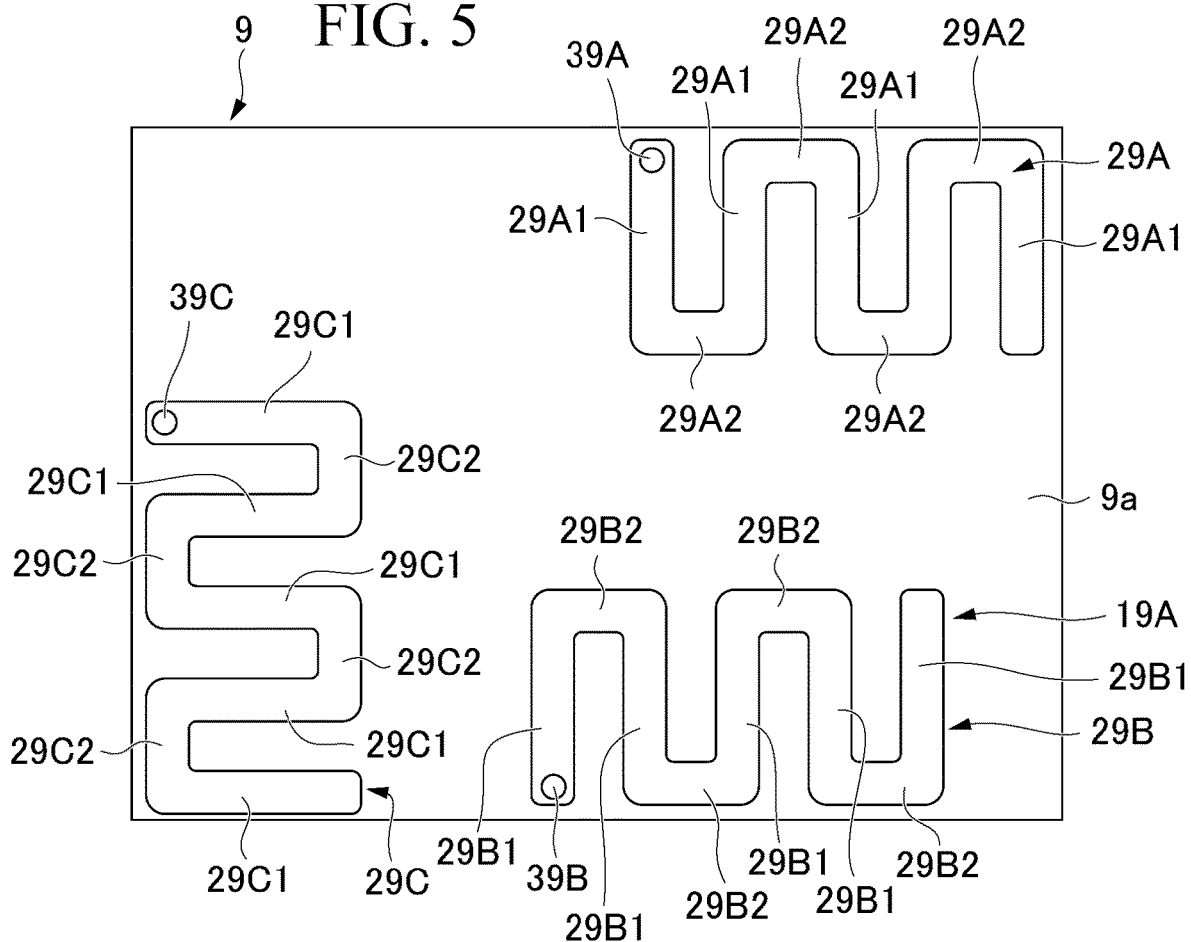
FIG. 5 is a bottom view of a substrate 9 on which a reservoir layer 19A is formed.

FIG. 5 is a bottom view of the substrate 9. As shown in FIG. 5, the reservoir layer 19A includes a plurality of (three in FIG. 5) flow path type reservoirs 29A, 29B, and 29C which are arranged in the lower surface 9a of the substrate 9 (in the following description, typically referred to as a reservoir 29). A flow path type reservoir is a reservoir which is constituted of a long and thin flow path in which a length is greater than a width. Each of the reservoirs 29A, 29B, and 29C can independently accommodate a solution. Each of the reservoirs 29A, 29B, and 29C is constituted of a linear recess (for example, a concave part, a groove) which is formed in an in-plane direction of the lower surface 9a (for example, one in-plane direction or a plurality of in-plane directions of the lower surface 9a, a direction parallel to an in-plane direction of the lower surface 9a, or the like) when the substrate 9 is seen from the upper plate 6 side.

The reservoirs 29A, 29B, and 29C includes a meandering flow path in which the linear recess meanders along a predetermined direction while being horizontally folded back. Describing the reservoir 29A, the reservoir 29A is formed in a meandering shape including a plurality of (five in FIG. 5) first straight portions 29A1 that linearly extend along a first direction which is the vertical direction in FIG. 5 and that are arranged in parallel with and to be spaced from each other in a second direction which is a right-to-left direction in FIG. 5 perpendicular to the first direction and a second straight portion (second flow path) 29A2 which repeatedly connects connection points between ends of the adjacent first straight portions (first flow path) 29A1 alternately at a first end side and a second end side of the first straight portion 29A1. Similarly to the reservoir 29A, the reservoirs 29B and 29C are formed in a meandering shape. The first straight portion (first flow path) 29A1 and the second straight portion (second flow path) 29A2 need not be perpendicular and may be crossed. When the first straight portion 29A1 and the second straight portion 29A2 are perpendicular, the first flow path and the second flow path can be arranged in parallel, and therefore, a flow path that can hold a large capacity can be made compactly and conveniently.

(Stationary Condition of Solution)

In the fluidic device 1, although a solution S is accommodated in the reservoir 29A before the detection process of the sample material described above, there may be cases in which the reservoir 29A is not in a state of being filled with the solution S but includes air (bubble) at a distal end. There is a possibility that since the fluidic device 1 in this state is tilted during storage or during transfer, or a force (acceleration) is applied to the solution S due to an upside down attitude, it may become difficult to hold the solution S as a continuous body in the reservoir 29A. Specifically, in a case where the cross-sectional area of the flow path of the reservoir 29A is large as described below, by acceleration being applied to the solution S, a bubble is easily mixed into the solution S. In a case where the solution S is not held as a continuous body, and a bubble is present in the middle of the solution S which is linearly held in the reservoir 29A, there is a possibility that a bubble is included in the solution S supplied from the reservoir 29A to the flow path 11 via the supply hole 39. Thereby, for example, even if the flow path 11 is partitioned to a predetermined length, the solution S cannot be quantified in a predetermined quantity. Further, the mixed bubble becomes an obstacle of reaction or detection of a target material. Therefore, it is important to set the reservoir 29A in consideration of a condition for making the solution S to be relatively stationary with respect to the reservoir 29A.

Figure 6:
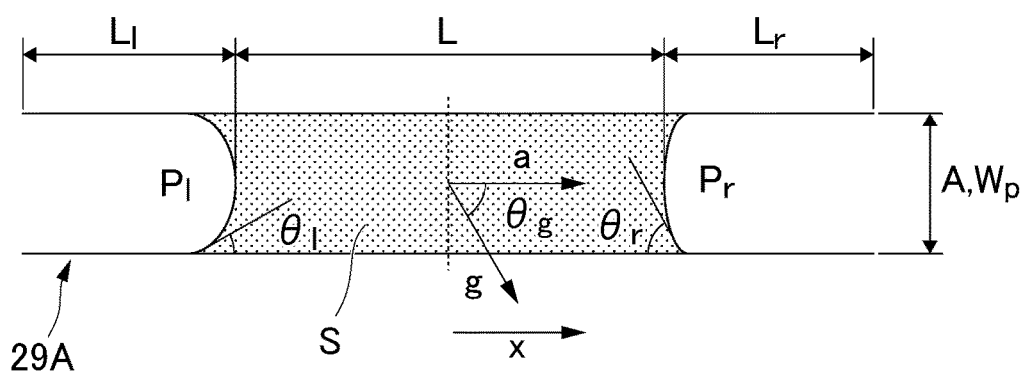
FIG. 6 is a cross-sectional view along a length direction of a reservoir 29A.

FIG. 6 is, as an example, a cross-sectional view along a length direction of a reservoir 29A. FIG. 6 schematically shows a state in which the solution S is accommodated in the reservoir 29A. Since the reservoirs 29A, 29B, and 29C have the same configuration, a stationary condition of the solution in the reservoir 29A is described with reference to FIG. 6.

In FIG. 6, a symbol "g" represents a gravitational acceleration (m/s$^2$), and the reservoir 29A extends in a direction that crosses by angle $\theta g(°)$ with a direction (vertically downward direction) in which the gravitational acceleration g is applied. A symbol "a" represents an acceleration (m/s$^2$) applied to solution S other than the gravity, and the acceleration "a" is applied along a direction in which the reservoir 29A extends. A symbol "A" represents a cross-sectional area (m$^2$) of the reservoir 29A. A symbol "Wp" represents a wetted perimeter length (m) which is a circumferential length in a cross-section perpendicular to the length direction of the reservoir 29A. The density of the solution S is $\rho$ (kg/m$^3$), the surface tension of the solution S is $\gamma$ (N/m), and the liquid length of the solution S in the reservoir 29A is L (m). At a first side (right side in FIG. 6) in the length direction of the reservoir 29A, a pressure that acts on the solution S is Pr (N/m$^2$), and a contact angle of the solution S is $\theta r(°)$. At another side (left side in FIG. 6) in the length direction of the reservoir 29A, a pressure that acts on the solution S is Pl (N/m$^2$), and a contact angle of the solution S is $\theta l(°)$.

A force Fa(N) by an acceleration that acts on the solution S is represented by Expression (1).

$$Fa = \rho \times A \times L \times (a + g \times \cos \theta g) \quad (1)$$

A force Fp(N) by a pressure that acts on the solution S is represented by Expression (2).

$$Fp = -A \times (Pr - Pl) \quad (2)$$

A force Fs(N) by a surface tension that acts on the solution S is represented by Expression (3).

$$Fs = \gamma \times Wp \times (\cos \theta r - \cos \theta l) \quad (3)$$

From Expressions (1) to (3), a force F(N) that acts on the solution S is represented by Expression (4).

$$F = Fa + Fp + Fs \quad (4)$$

Here, in a case where the solution S is displaced in a direction x (right side in FIG. 6), when a receding contact angle is α (°), and an advancing contact angle is β (°), a force Fs0 by the surface tension at the time of displacement of the solution S is represented by Expression (5).

$$Fs0 = \gamma \times Wp \times (\cos \alpha - \cos \beta) \quad (5)$$

When a static contact angle is θ(°) in a case where the solution S is not displaced, a relationship α≤θ≤β is satisfied, and since a condition where the solution S is stationary in the reservoir 29A is F=0 indicated by Expression (4), Expression (6) is established.

$$-\gamma \times Wp \times (\cos \alpha - \cos \beta) \leq \rho \times A \times L \times (a + g \times \cos \theta g) - A \times (Pr - Pl) \leq \gamma \times Wp \times (\cos \alpha - \cos \beta) \quad (6)$$

In a case where both sides of the solution S in reservoir 29A are open, a relationship Pr=Pl=an initial flow path pressure is satisfied, and therefore, the stationary condition of the solution S is represented by Expression (7).

$$\rho \times A \times L \times (a + g \times \cos \theta g) \leq \gamma \times Wp \times (\cos \alpha - \cos \beta) \quad (7)$$

Accordingly, a length L in which the solution S is held in reservoir 29A is represented by Expression (8).

$$L \leq (\gamma \times Wp \times (\cos \alpha - \cos \beta))/(\rho \times A \times (a + g \times \cos \theta g)) \quad (8)$$

Since a case (θg=0) where the direction in which the acceleration "a" acts is matched with the direction in which the gravitational acceleration "g" acts is the strictest condition among conditions in which the solution S is held in the reservoir 29A, the length L in which the solution S is held in the reservoir 29A is represented by Expression (9) even under the strictest condition.

$$L \leq (\gamma \times Wp \times (\cos \alpha - \cos \beta))/(\rho \times A \times (a + g)) \quad (9)$$

Here, when an acceleration applied to the solution S including the gravitational acceleration "g" and an external acceleration "a" is G (m/s²), the length L in which the solution S is held in the reservoir 29A is represented by Expression (10).

$$L \leq (\gamma \times Wp \times (\cos \alpha - \cos \beta))/(\rho \times A \times G) \quad (10)$$

In Expression (10), a contact angle at which the length L is maximized includes a receding contact angle α=0° and an advancing contact angle β=180°. Accordingly, when a solution S having the receding contact angle α=0° and the advancing contact angle β=180 is used, the length L in which the solution S is held in the reservoir 29A is represented by Expression (11).

$$L \leq (2 \times \gamma \times Wp)/(\rho \times A \times G) \quad (11)$$

For example, in a case where the cross-sectional shape of the reservoir 29A is a circular shape having a radius R, since the cross-sectional area A is represented by A=2πR², and the wetted perimeter length Wp is represented by Wp=2πR, the length L in which the solution S is held in a stationary state in the reservoir 29A is represented by Expression (12).

$$L \leq 4 \times \gamma/(\rho \times R \times G) \quad (12)$$

For example, in a case where the cross-sectional shape of the reservoir 29A is a rectangular shape having a depth H (m) and a width W (m) in a direction along the lower surface 9a of the substrate 9 and perpendicular to the length direction, since the cross-sectional area A is represented by A=W×H, and the wetted perimeter length Wp is represented by Wp=2×(W+H), the length L in which the solution S is held in a stationary state in the reservoir 29A is represented by Expression (13).

$$L \leq 4 \times \gamma \times (W+H)/(\rho \times W \times H \times G) \quad (13)$$

Figure 7:
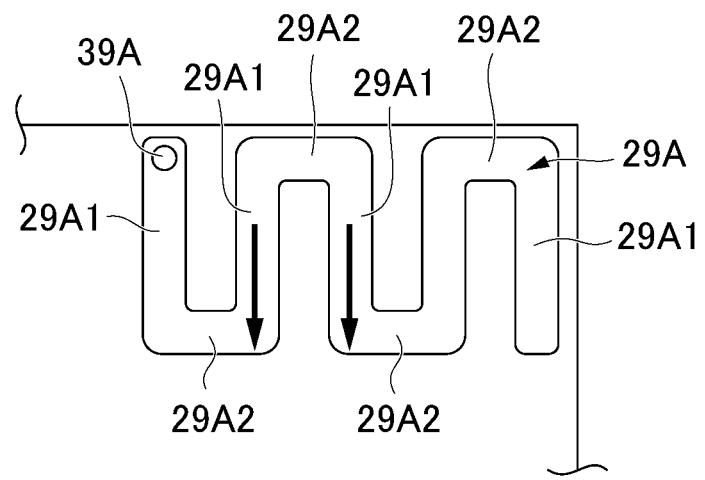
FIG. 7 is a partially enlarged view of the reservoir 29A.
Figure 8:
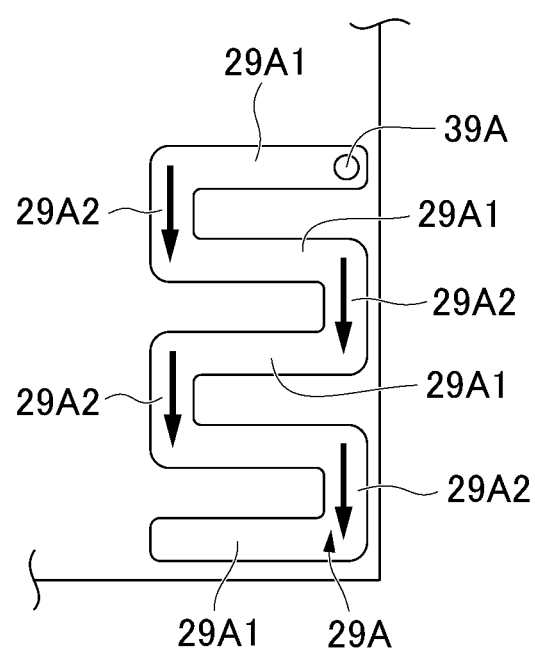
FIG. 8 is a partially enlarged view of the reservoir 29A.
Figure 9:
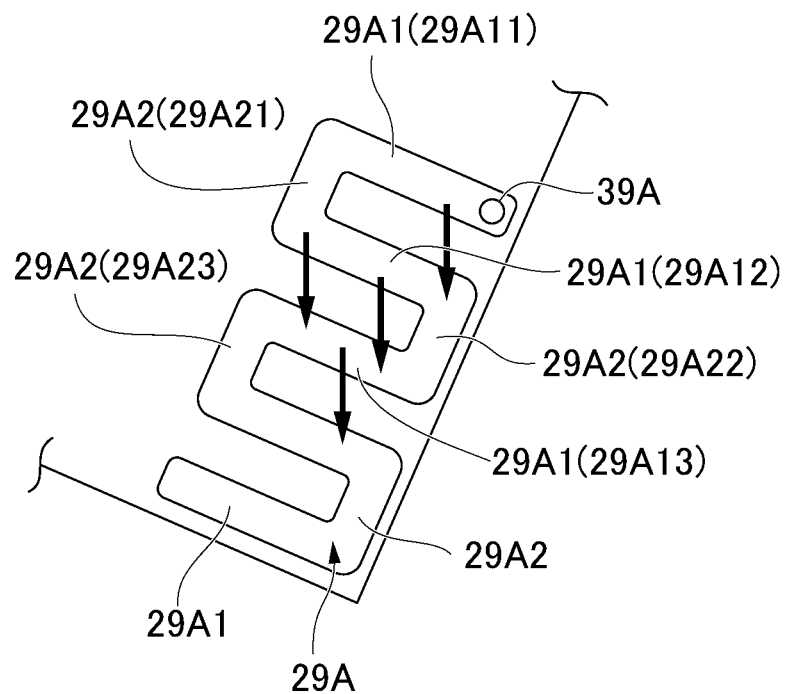
FIG. 9 is a partially enlarged view of the reservoir 29A.

FIG. 7 to FIG. 9 are a partially enlarged view of the reservoir 29A. As shown in FIG. 7, for example, in a case where the first straight portion 29A1 of the reservoir 29A is arranged in the vertical direction, and the second straight portion 29A2 is arranged in the horizontal direction, an acceleration (gravity) that displaces the solution S does not act with respect to the second straight portion 29A2. Therefore, if the length L of each first straight portion 29A1 satisfies Expression (10), the solution S accommodated in the first straight portion 29A1 is held in a stationary state in the first straight portion 29A1. Further, with respect to the solutions S of the first straight portions 29A1 connected together by the second straight portion 29A2, the impact of the gravity is reduced due to an effect by balancing of gravitational forces as shown by arrows.

As shown in FIG. 8, for example, in a case where the second straight portion 29A2 of the reservoir 29A is arranged in the vertical direction, and the first straight portion 29A1 is arranged in the horizontal direction, an acceleration (gravity) that displaces the solution S does not act with respect to the first straight portion 29A1. Therefore, if the length L of the second straight portion 29A2 satisfies Expression (10), the solution S accommodated in the second straight portion 29A2 is held in a stationary state in the first straight portion 29A1.

As shown in FIG. 9, for example, in a case where both the first straight portion 29A1 and the second straight portion 29A2 of the reservoir 29A are arranged neither in the vertical direction nor the horizontal direction, since a crossing section of a first straight portion 29A11 arranged at an uppermost position crossing with a second straight portion 29A21 is located at a higher position than a penetration portion 39A, the acceleration (gravity) that acts on the solution S accommodated in the first straight portion 29A11 does not act on the solution S accommodated in the second straight portion 29A21. An acceleration (gravity) acting on the solution S accommodated in the second straight portion 29A21, a first straight portion 29A12, and a second straight portion 29A22 acts on a first straight portion 29A13, but a crossing section of the first straight portion 29A13 crossing with the second straight portion 29A22 is located at a lower position than a crossing section of the first straight portion 29A13 crossing with the second straight portion 29A23. Therefore, the acceleration (gravity) acting on the solution S accommodated in the first straight portion 29A13 offsets (cancels out) the acceleration (gravity) acting on the solution S accommodated in the first straight portion 29A12 having an equal length. As a result, if the length L of the second straight portion 29A2 satisfies Expression (10), the solution S accommodated in the second straight portion 29A2 is held in a stationary state in the first straight portion 29A1.

When the solution S accommodated in the reservoir 29A is supplied to the flow path 11 via a supply hole 39, the solution S needs to be supplied to the flow path 11 without allowing a bubble accommodated in the reservoir 29A to precede the solution S. As described above, depending on an attitude of the fluidic device 1, in response to a relative relationship between an impact by a capillary force on the solution S and an impact by an acceleration which includes the gravity and which is applied to the solution S, a bubble accommodated in the reservoir 29A may precede the solution S and be supplied to the flow path 11.

The relative relationship between the impact by the capillary force on the solution and the impact by the acceleration which includes the gravity and which is applied to the solution is represented by a capillary length which is calculated on the basis of a surface tension and a density of the solution S accommodated in each reservoir 29A and an acceleration which includes the gravity and which is applied to the solution. The capillary length $\kappa^{-1}$ is calculated by Expression (14).

$$\kappa^{-1}=(\gamma/(\rho \times G))^{1/2} \qquad (14)$$

In a case where a size of an inscribed circle radius in the cross-section of the reservoir 29A is larger than the capillary length calculated by Expression (14), with respect to the impact on the solution S of the reservoir 29A, the acceleration which includes the gravity and which is applied to the solution S becomes larger than the capillary force. In this case, for example, if a surface including the reservoir 29A is inclined relative to the horizontal surface, since the solution S cannot be held by the surface tension, and the interface between the solution S and the reservoir 29A collapses, there is a possibility that the bubble accommodated in the reservoir 29A may precede the solution S and be supplied to the flow path 11.

For example, Patent Document 1 describes that a flow path type is preferable such that a reagent does not remain in a reagent tank. However, even if the reagent tank is of a flow path type actually, but in a case where the cross-sectional area of the flow path is large, there is a problem in that the bubble precedes a liquid. Therefore, the reservoir shown in the present embodiment is a flow path type reservoir which is developed to have a shape in which the bubble does not precede the liquid while increasing the cross-sectional area of the flow path as much as possible and increasing an amount of reagent which can be held.

That is, in a case where the size of the inscribed circle radius in the cross-section of the reservoir 29A is smaller than the capillary length calculated by Expression (14), with respect to the impact on the solution accommodated in the reservoir 29A, the capillary force becomes larger than the acceleration which includes the gravity and which is applied to the solution. In this case, even when the surface including the reservoir 29A is inclined relative to the horizontal surface, the solution S can be held by the surface tension, the interface between the solution and the reservoir 29A does not collapse, and it is possible to supply the solution S to the flow path 11 while the bubble does not precede the solution S held in the recess by the capillary force.

As described above, in the fluidic device 1 of the present embodiment, since the reservoirs 29A, 29B, and 29C includes the meandering flow path, and the first straight portion and the second straight portion are locally arranged and cross with each other, with respect to each of the reservoirs 29A, 29B, and 29C, it is possible to prevent the acceleration G from acting over the entire length in a direction (length direction of each straight portion) in which the solution S is displaced. Therefore, in the fluidic device 1 of the present embodiment, by setting a length L that satisfies Expression (10) for each straight portion, it is possible to hold the solution S in a stationary state as a continuous body without depending on the attitude. As a result, in the fluidic device 1 of the present embodiment, it becomes possible to form the reservoirs 29A, 29B, and 29C having a large cross-sectional area in comparison with a case in which the cross-sectional area A is set using the entire length of the reservoir 29A and Expression (10). Accordingly, in the fluidic device 1 of the present embodiment, it is possible to hold a large amount of solution S in a stationary state as a continuous body in the reservoirs 29A, 29B, and 29C without depending on the attitude.

Second Embodiment of Fluidic Device

Next, a fluidic device 1 of a second embodiment is described with reference to FIG. 10 and FIG. 11. In the drawing, the same elements as the elements in the first embodiment illustrated in FIGS. 1 to 9 will be referred to by the same reference signs and a description thereof will be omitted.

Figure 10:
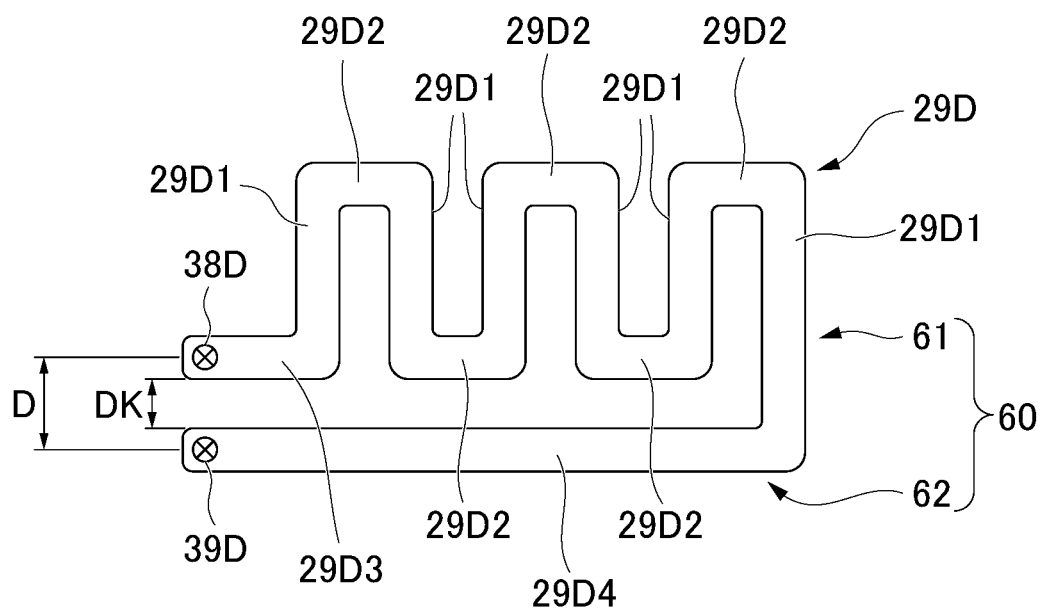
FIG. 10 is a schematic plan view of a reservoir 29D according to a second embodiment.
Figure 11:
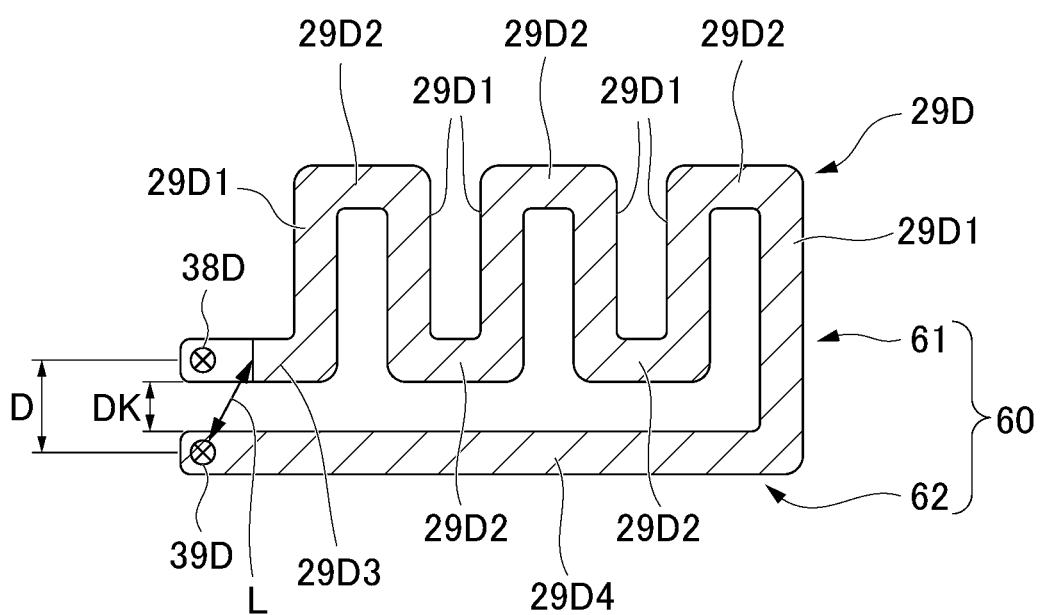
FIG. 11 is a schematic plan view showing a modified example of a reservoir 29D according to the second embodiment.

FIG. 10 is a schematic plan view of a reservoir 29D.

As shown in FIG. 10, the reservoir 29D includes a detour flow path 60 that connects a supply hole (second penetration hole) 39D which penetrates in the vertical direction through the substrate 9 (not shown in FIG. 10) to a penetration hole (first penetration hole) 38D which constitutes an injection hole. The detour flow path 60 is formed in a flow path length longer than a distance D between the supply hole 39D and the penetration hole 38D, detours, and connects together the supply hole 39D and the penetration hole 38D. The size of an inscribed circle radius in the cross-section of the detour flow path 60 is set to a smaller value than the capillary length calculated by Expression (14).

The detour flow path 60 includes a meandering flow path 61 and a fourth straight portion 29D4. The meandering flow path 61 includes a first flow path 29D1, a second flow path 29D2, and a third flow path 29D3. The first flow paths 29D1 extend linearly along a direction (vertical direction in FIG. 10; a first direction) in which the supply hole 39D and the penetration hole 38D are arrayed, and arranged to be spaced from each other in a second direction (right-to-left direction in FIG. 10) that crosses with the first direction. The second flow path 29D2 extends linearly along the second direction and is arranged such that a connection between first end sides of the adjacent first flow paths 29D1 and a connection between second end sides of the adjacent first flow paths 29D1 are alternately switched along the second direction for each first flow path 29D1.

The third flow path 29D3 extends in parallel with the second flow path 29D2. The third flow path 29D3 connects an end part of the first flow path 29D1 closest to the penetration hole 38D to the penetration hole 38D. The fourth straight portion 29D4 extends in parallel with the second flow path 29D2. The fourth straight portion 29D4 is arranged at a position of a distance D from the second flow path 29D2. The fourth straight portion 29D4 connects an end part of the first flow path 29D1 farthest from the penetration hole 38D to the supply hole 39D.

In the detour flow path 60, the sum of flow path lengths of the second flow path 29D2 and the third flow path 29D3 is equal to a flow path length of the fourth straight portion 29D4. Accordingly, in a case where the detour flow path 60 is filled with a solution, even when the second direction in which the second flow path 29D2, the third flow path 29D3, and the fourth straight portion 29D4 extend is the vertical direction, and the solution most strongly receives an impact of gravitational acceleration, the impact of gravity on the solution is cancelled out as described above.

In the above detour flow path 60, among six first flow paths 29D1, five first flow paths 29D1 near the penetration hole 38D have the same length. The first flow path 29D1 which is farthest from the penetration hole 38D is longer by a distance DK than the other first flow paths 29D1. The distance DK is a gas-liquid interface distance when the reservoir 29D is filled with the solution. Accordingly, in a case where the first direction in which the first flow path 29D1 extends is the vertical direction, and the solution most strongly receives the impact of gravitational acceleration, the impact of gravity is not cancelled out at the distance DK. Therefore, with respect to the reservoir 29D, if the distance DK is the length L, and Expression (10) is satisfied, the solution accommodated in the detour flow path 60 is held in a stationary state in the detour flow path 60, and thereby, operations and advantages similar to those of the first embodiment described above are obtained.

The second embodiment is described using a case in which the detour flow path 60 is filled with the solution. However, for example, as shown in FIG. 11, in a case where part of the detour flow path 60 is not filled with the solution, if the distance L between a gas-liquid interface on the penetration hole 38D side and a gas-liquid interface on the supply hole 39D side satisfies Expression (10), the solution accommodated in the detour flow path 60 is held in a stationary state in the detour flow path 60, and thereby, operations and advantages similar to those of the first embodiment described above are obtained.

Figure 12:
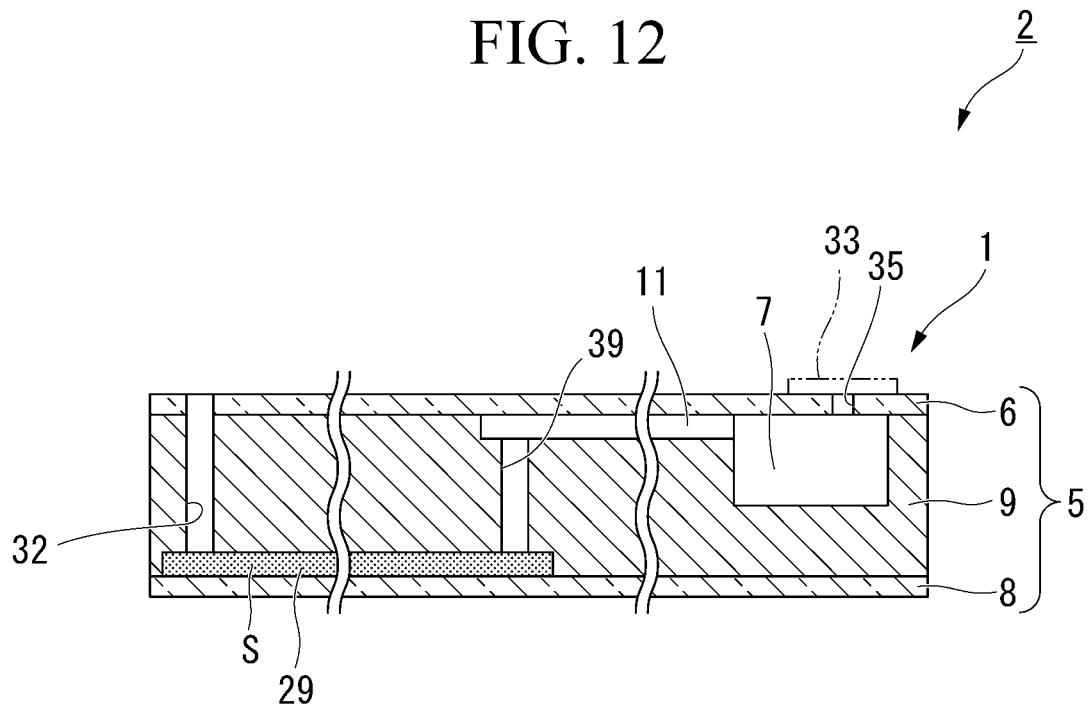
FIG. 12 is a schematic cross-sectional view of a reservoir supply system of an embodiment.

Next, a reservoir supply system 2 that fills the reservoir 29 of the fluidic device 1 with the solution S is described with reference to FIG. 12. FIG. 12 is a schematic cross-sectional view of the reservoir supply system 2. In FIG. 12, a supply hole 39 of the fluidic device 1, a reservoir 29, a flow path 11, and a waste solution tank 7 are shown in sequence.

A syringe or the like (not shown) is inserted into the injection hole 32, and the reservoir supply system 2 feeds the solution at the position of the reservoir 29. At this time, valves V, Vi, and Vo in the flow path 11 shown in FIG. 2 are opened. The air hole 35 which opens to the waste solution tank 7 is opened to the outside. Thereby, the reservoir 29 communicates with the outside via the supply hole 39, the flow path 11, the waste liquid reservoir 7, and the air hole 35. By feeding the solution S to the reservoir 29, air in the reservoir 29 is pushed out to the supply hole 39 side, and the solution S is filled into the reservoir 29.

The fluidic device 1 in which the solution S is filled in the reservoir 29 can hold the solution S in a stationary state as a continuous body even when acceleration of about 6G including the gravitational acceleration is applied during storage or during transport since the reservoir 29 is formed to have a length and a cross-sectional area that satisfy Expression (10) as described above.

The air hole 35 may be blocked by a film 33 during storage or during transport before the fluidic device 1 is used for testing and inspection. That is, as illustrated by a virtual line (two-dot chain line) in FIG. 12, the fluidic device 1 may have the film 33. In this case, the supply hole 39, the flow path 11, the waste solution tank 7, and the air hole 35 are sealed, and it is possible to further effectively prevent the flow of the solution S from the reservoir 29 to the supply hole 39 side.

(Flow Path Supply System)

Next, a flow path supply system 4 that supplies the solution S to the flow path 11 from the reservoir 29 in the fluidic device 1 is described with reference to FIG. 13.

Figure 13:
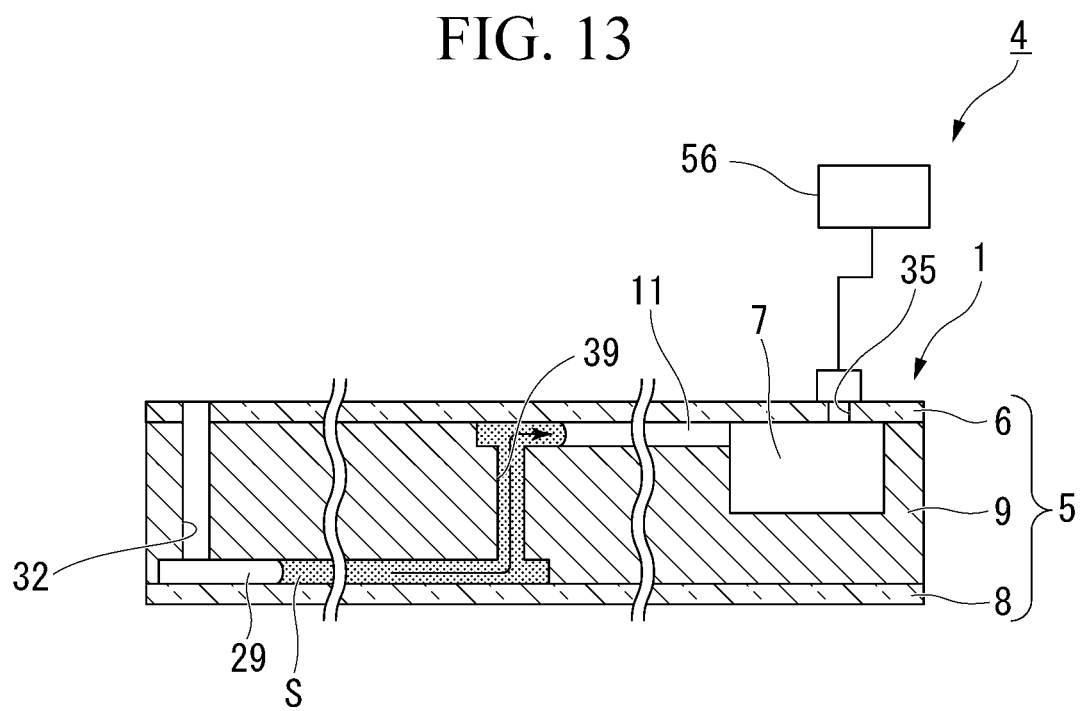
FIG. 13 is a schematic cross-sectional view of a flow path supply system of the embodiment.

FIG. 13 is a schematic cross-sectional view of the flow path supply system 4. In FIG. 13, the supply hole 39 of the fluidic device 1, the reservoir 29, the flow path 11, and the waste solution tank 7 are shown in sequence.

The flow path supply system 4 includes the fluidic device 1 and the suction device (negative pressure applying device) 56. As shown in FIG. 13, the suction device 56 is connected to the air hole 35 of the fluidic device 1. The suction device 56 makes the inside of the flow path 11 to be a negative pressure via the air hole 35.

The flow path supply system 4 allows the solution S filled in advance in the reservoir 29 to move from the reservoir 29 to the flow path 11. More specifically, the flow path supply system 4 sequentially introduces the solution S from the reservoir 29 into each quantitation section 18 of the circulation flow path 10 illustrated in FIG. 2. Here, a procedure of introducing the solution S into one quantitation section 18 is described, but the solution S is introduced into another quantitation section 18 by performing a similar procedure.

With reference to FIG. 2, the opening and closing of the valves V, Vi, and Vo when introducing the solution S into the quantitation section 18 is described. First, a pair of quantitation valves V located on both sides in the length direction of the quantitation section 18 into which the solution S is introduced are closed. Further, a waste liquid valve Vo of a drain flow path 13 connected to a corresponding quantitation section 18 is opened, and a waste liquid valve Vo of another drain flow path 13 is closed. Further, an introduction valve Vi of an introduction flow path 12 connected to a corresponding quantitation section 18 is opened.

Next, the inside of the waste solution tank 7 is suctioned by a negative pressure from the air hole 35 by using the suction device 56. Thereby, the solution S in the reservoir 29 moves to the flow path 11 side via the supply hole 39. Further, air passing through the injection hole 32 is introduced behind the solution S of the reservoir 29. Thereby, the flow path supply system 4 introduces the solution S accommodated in the reservoir 29 into the quantitation section 18 of the circulation flow path 10 via the supply hole 39 and the introduction flow path 12.

(Solution Mixing System)

Next, a solution mixing system that mixes the solution supplied to the flow path of the fluidic device 1 is described with reference to FIG. 2. The solution mixing system includes the fluidic device 1 and a control part (not shown) that controls a pump (not shown) which circulates the solution in the flow path 11 of the fluidic device 1.

First, in a state where the solution is introduced to each quantitation section 18 of the circulation flow path 10 as described above, the waste liquid valve Vo and the introduction valve Vi are closed, and the quantitation valve V is opened. Further, the solution in the circulation flow path 10 is pumped and circulated using the pump (not shown). The flow rate of the solution that circulates in the circulation flow path 10 is low in the vicinity of the wall surface and is high at the middle of the flow path by an interaction (friction) between the solution and the flow path wall surface inside the flow path. As a result, since the flow rates of the solution are distributed, mixing and reaction of the solution are promoted.

Third Embodiment of Fluidic Device

Next, a third embodiment of a fluidic device is described with reference to FIG. 14 to FIG. 19. In the drawings, the same elements as the elements in the first and second embodiments illustrated in FIG. 1 to FIG. 13 are referred to by the same reference signs and a description thereof is omitted.

Figure 14:
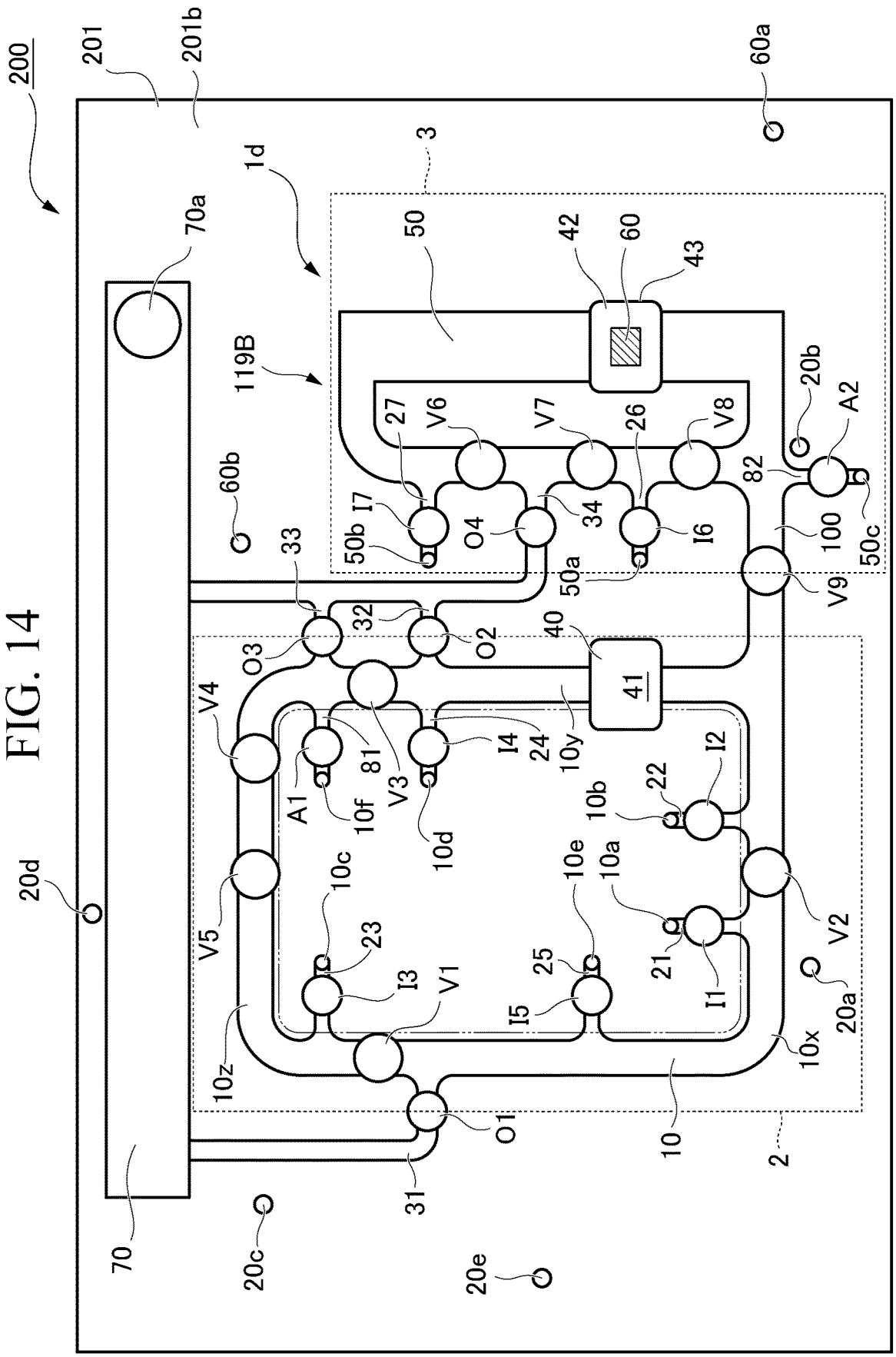
FIG. 14 is a schematic plan view of a fluidic device according to the embodiment.

FIG. 14 is a plan view schematically illustrating a fluidic device 200 according to the third embodiment. The fluidic device 200 is a device that detects, for example, an antigen (a sample material, a biomolecule) which is a detection target included in a test sample by an immune reaction and an enzyme reaction. The fluidic device 200 includes a substrate 201 in which a flow path and a valve are formed. FIG. 14 schematically illustrates a reaction layer 119B on an upper surface 201b side of the substrate 201. Part of the reaction layer 119B is formed on a lower surface side of the upper plate 6 and is formed in the substrate 201 other than the upper plate 6 in the following description.

The fluidic device 200 includes a circulation type mixer 1d. The circulation type mixer 1d includes a first circulating portion 2 in which a solution including carrier particles circulates and a second circulating portion 3 in which a solution introduced from the circulation flow path 10 circulates. The first circulating portion 2 includes the circulation flow path 10 in which a solution including carrier particles circulates, circulation flow path valves V1, V2, and V3, and a capture portion 40. The second circulating portion 3 includes a second circulation flow path 50 in which a solution introduced from the circulation flow path circulates, a capture portion 42 that is provided in the second circulation flow path 50, and a detection portion 60 that is provided in the second circulation flow path 50 and detects a sample material which is coupled to the carrier particles. In the first circulating portion 2, pretreatment for detecting the sample material can be performed by circulating the sample material in the circulation flow path 10 to be coupled to the carrier particles and a detection assisting material (for example, a marker material). The pretreated sample material is transferred from the first circulating portion 2 to the second circulating portion 3. In the second circulating portion 3, the pretreated sample material is detected in the second circulation flow path 50. The pretreated sample material repeatedly comes into contact with the detection portion 60 by circulating in the second circulation flow path 50 and is efficiently detected.

The capture portion 40 includes a capturing means installing portion 41 that is provided in the circulation flow path 10 and in which a capturing means capturing carrier particles can be installed. The carrier particles are, for example, particles which can react with a sample material which is a detection target. Examples of the carrier particles which are used in the present embodiment include magnetic beads, magnetic particles, gold nanoparticles, agarose beads, and plastic beads. Examples of the sample material include biomolecules such as nucleic acid, DNA, RNA, peptides, proteins, and extracellular endoplasmic reticula. Examples of the reaction between the carrier particles and the sample material include coupling between the carrier particles and the sample material, adsorption between the carrier particles and the sample material, modification of the carrier particles by the sample material, and chemical change of the carrier particles by the sample material. Examples of the capture portion 40 include a magnetic force source such as a magnet as the capturing means when magnetic beads or magnetic particles are used as the carrier particles. Examples of another capturing means include a column having a filler material which can be coupled to the carrier particles and an electrode which can attract the carrier particles.

The detection portion 60 is disposed to face the capture portion 42 such that the sample material coupled to the carrier particles captured in the capture portion 42 having the same configuration as the capture portion 40 can be detected.

Introduction flow paths 21, 22, 23, 24, and 25 that introduces first to fifth solutions are connected to the circulation flow path 10. Introduction flow path valves I1, I2, I3, I4, and I5 that open and close the introduction flow paths are provided in the introduction flow paths 21, 22, 23, 24, and 25. An introduction flow path 81 that introduces (or discharges) air is connected to the circulation flow path 10, and an introduction flow path valve A1 that opens and closes the introduction flow path is provided in the introduction flow path 81. Discharge flow paths 31, 32, and 33 are connected to the circulation flow path 10. Discharge flow path valves O1, O2, and O3 that open and close the discharge flow paths are provided in the discharge flow paths 31, 32, and 33. A first circulation flow path valve V1, a second circulation flow path valve V2, and a third circulation flow path valve V3 that partition the circulation flow path 10 are provided in the circulation flow path 10. The first circulation flow path valve V1 is disposed in the vicinity of a connecting portion between the discharge flow path 31 and the circulation flow path 10. The second circulation flow path valve V2 is disposed between a connecting portion between the introduction flow path 21 and the circulation flow path 10 and a connecting portion between the introduction flow path 22 and the circulation flow path 10 and in the vicinity thereof. The third circulation flow path valve V3 is disposed between a connecting portion between the discharge flow path 32 and the circulation flow path 10 and a connecting portion between the discharge flow path 33 and the circulation flow path 10 and in the vicinity thereof.

In this way, the circulation flow path 10 are partitioned into three flow paths 10x, 10y, and 10z when the first circulation flow path valve V1, the second circulation flow path valve V2, and the third circulation flow path valve V3 are closed, and at least one introduction flow path and at least one discharge flow path are connected to each partitioned section.

Introduction flow paths 26 and 27 are connected to the second circulation flow path 50. Introduction flow path valves I6 and I7 that open and close the introduction flow paths are provided in the introduction flow paths 26 and 27. An introduction flow path 82 that introduces air is connected to the second circulation flow path 50, and an introduction flow path valve A2 that opens and closes the introduction flow path is provided in the introduction flow path 82. A discharge flow path 34 is connected to the second circulation flow path 50. A discharge flow path valve O4 that opens and closes the discharge flow path is provided in the discharge flow path 34.

Pump valves V3, V4, and V5 are provided in the circulation flow path 10. Here, the third circulation flow path valve V3 is also used as a pump valve. Pump valves V6, V7, and V8 are provided in the second circulation flow path 50.

For example, the volume in the second circulation flow path 50 is preferably set to be less than the volume in the circulation flow path 10. Here, the volume in a circulation flow path includes a volume in the circulation flow path when a solution circulates in the circulation flow path. The volume in the circulation flow path 10 is, for example, a volume in the circulation flow path 10 when the valves V1, V2, V3, V4, and V5 are open and the valves I1, I2, I3, I4, I5, O1, O2, O3, A1, and V9 are closed. The volume in the second circulation flow path 50 is, for example, a volume in the second circulation flow path 50 when the valves V6, V7, and V8 are open and the valves I6, I7, O4, A2, and V9 are closed. For example, by making the volume in the second circulation flow path 50 to be less than the volume in the circulation flow path 10, an amount of solution circulating in the second circulation flow path 50 is less than an amount of solution circulating in the circulation flow path 10. Therefore, in the fluidic device 200, an amount of chemical (reagent) which is used for detection can be reduced. In the fluidic device 200, the volume in the second circulation flow path 50 is less than the volume in the circulation flow path 10, and thereby, it is possible to improve detection sensitivity. For example, when a detection target material is dispersed or resolved in the solution in the second circulation flow path 50, it is possible to improve detection sensitivity by decreasing an amount of solution in the second circulation flow path 50. The volume in the second circulation flow path 50 may be greater than the volume in the circulation flow path 10. In this case, in the fluidic device 200, the amount of solution circulating in the second circulation flow path 50 is greater than the amount of solution circulating in the circulation flow path 10. In this case, in the fluidic device 200, the second circulation flow path 50 may be filled, for example, by transferring the solution circulating in the circulation flow path 10 to the second circulation flow path 50 and adding a measuring solution or a substrate solution thereto.

The circulation flow path 10 and the second circulation flow path 50 are connected to each other via a connecting flow path 100 that connects together the circulation flow paths. A connecting flow path valve V9 that opens and closes the connecting flow path 100 is provided in the connecting flow path 100. In the fluidic device 200, a solution is circulated in the circulation flow path 10 in a state in which the connecting flow path valve V9 is closed, and pretreatment is performed. After pretreatment of the solution, the connecting flow path valve V9 is opened, and the solution is transferred to the second circulation flow path via the connecting flow path. Thereafter, the connecting flow path valve V9 is closed, the solution is circulated in the second circulation flow path, and a detection reaction is performed. Thereby, since a pretreated sample is transferred to the second circulation flow path after necessary pretreatment has been performed, it is possible to prevent an unnecessary material from circulating in the second circulation flow path 50. Therefore, it is possible to prevent unnecessary contamination or noise at the time of detection. For example, the circulation flow path 10 and the second circulation flow path 50 do not share any flow path in which a solution can circulate. In the fluidic device 200, since a flow path in which a solution can circulate is not shared, it is possible to reduce a possibility that residues attached to the wall surface in the circulation flow path 10 and the like are circulated in the second circulation flow path 50 and to reduce contamination at the time of detection in the second circulation flow path 50 due to residues remaining in the circulation flow path 10.

The fluidic device 200 includes introduction inlets for a sample, a reagent, and air which are introduced. The fluidic device 200 includes a first reagent-introduction inlet 10a which is a penetration portion provided at an end of the introduction flow path 21, a sample-introduction inlet 10b which is a penetration portion provided at an end of the introduction flow path 22, a second reagent-introduction inlet 10c which is a penetration portion provided at an end of the introduction flow path 23, a cleaning solution-introduction inlet 10d which is a penetration portion provided at an end of the introduction flow path 24, a transfer solution-introduction inlet 10e which is a penetration portion provided at an end of the introduction flow path 25, and an air-introduction inlet 10f that is provided at an end of the introduction flow path 81.

The first reagent-introduction inlet 10a, the sample-introduction inlet 10b, the second reagent-introduction inlet 10c, the cleaning solution-introduction inlet 10d, the transfer solution-introduction inlet 10e, and the air-introduction inlet 10f are open from the upper surface 201b of the substrate 201. The first reagent-introduction inlet 10a is connected to a reservoir 215R which will be described later. The sample-introduction inlet 10b is connected to a reservoir 213R which will be described later. The second reagent-introduction inlet 10c is connected to a reservoir 214R which will be described later. The cleaning solution-introduction inlet 10d is connected to a reservoir 212R which will be described later. The transfer solution-introduction inlet 10e is connected to a reservoir 222R which will be described later.

The fluidic device 200 includes a substrate solution-introduction inlet 50a which is a penetration portion provided at an end of the introduction flow path 26, a measuring solution-introduction inlet 50b which is a penetration portion provided at an end of the introduction flow path 27, and an air-introduction inlet 50c that is provided at an end of the introduction flow path 82. The substrate solution-introduction inlet 50a, the measuring solution-introduction inlet 50b, and the air-introduction inlet 50c are open from the upper surface 201b of the substrate 201. The substrate solution-introduction inlet 50a is connected to a reservoir 224R which will be described later. The measuring solution-introduction inlet 50b is connected to a reservoir 225R which will be described later.

The discharge flow paths 31, 32, and 33 are connected to a waste solution tank 70. The waste solution tank 70 includes an outlet 70a. The outlet 70a is open from the upper surface 201b of the substrate 201, is connected to, for example, an external suction pump (not shown), and is subjected to negative-pressure suction.

Figure 15:
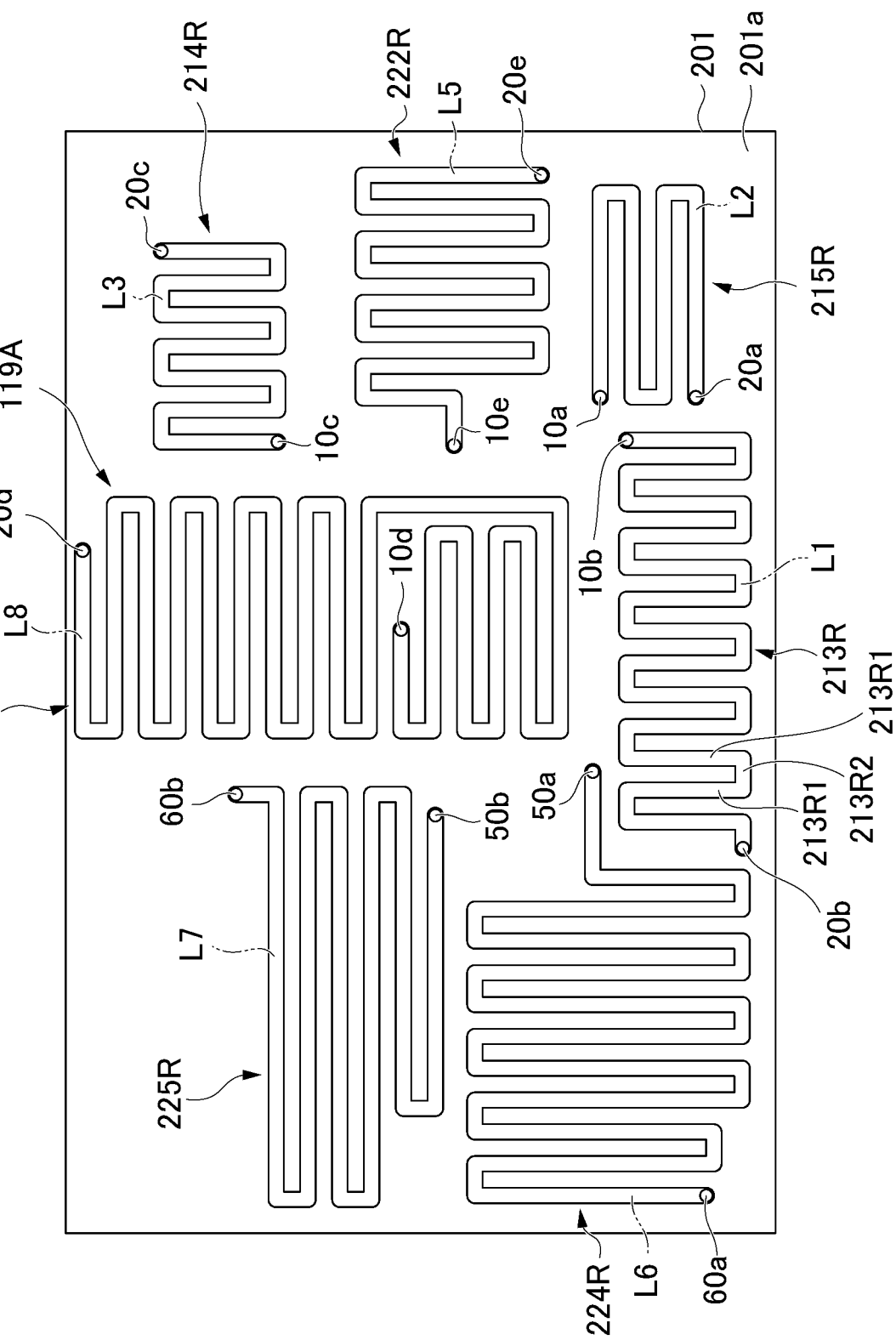
FIG. 15 is a bottom view schematically showing a reservoir layer of the embodiment.

Next, FIG. 15 is a bottom view schematically illustrating a reservoir layer 119A on a lower surface 201a side of the substrate 201. As illustrated in FIG. 15, the reservoir layer 119A includes a plurality of (seven in FIG. 15) flow path type reservoirs 212R, 213R, 214R, 215R, 222R, 224R, and 225R which are disposed in the lower surface 201a of the substrate 201. The reservoirs 212R, 213R, 214R, 215R, 222R, 224R, and 225R can independently accommodate solutions. The reservoirs 212R, 213R, 214R, 215R, 222R, 224R, and 225R are formed of a linear recess which if formed in an in-plane direction of the lower surface 201a (for example, one direction or a plurality of directions in the in-plane direction of the lower surface 201a, a direction parallel to the in-plane direction of the lower surface 201a, or the like).

Bottoms surfaces of the recesses in the reservoirs 212R, 213R, 214R, 215R, 222R, 224R, and 225R are substantially flush with each other. The recesses in the reservoirs 212R, 213R, 214R, 215R, 222R, 224R, and 225R have the same width. The cross-section of the recess is rectangular, for example, as illustrated in FIG. 5. The size of the cross-section of each of the reservoirs 212R, 213R, 214R, 215R, 222R, 224R, and 225R is formed to be a size according to the capillary length as described above. The cross-sectional area of each of the reservoirs 212R, 213R, 214R, 215R, 222R, 224R, and 225R is set to a value that satisfies Expression (10) on the basis of the stationary condition of the solution.

In the reservoirs 212R, 213R, 214R, 215R, 222R, 224R, and 225R, for example, the width of the recess is 1.5 mm, and the depth is 1.5 mm. The volume of the recess in the reservoirs 212R, 213R, 214R, 215R, 222R, 224R, and 225R is set depending on an amount of solution (a volume of a solution) required for performing a mixing/reaction on the basis of the capillary length. In the reservoirs 212R, 213R, 214R, 215R, 222R, 224R, and 225R, the length is set depending on an amount of solution accommodated therein on the basis of the capillary length. At least two reservoirs among the reservoirs 212R, 213R, 214R, 215R, 222R, 224R, and 225R in the present embodiment have a different volume from each other.

The width and the depth of the recess are an example, are preferably 0.1 mm to several tens of mm or less, and are more preferably 0.5 mm to several mm or less. In view of the relationship between the capillary force and the surface tension described above and the stationary condition of the solution, the width and the depth can be arbitrarily set depending on the size of the fluidic device (micro fluidic device or the like) 200.

For example, the reservoir 212R has a length of 360 mm and a volume of about 810 μL. The reservoir 213R has a length of 160 mm and a volume of about 360 μL. The reservoirs 214R and 215R have a length of 110 mm and a volume of about 248 μL. The reservoir 222R has a length of 150 mm and a volume of about 338 μL. The reservoir 224R has a length of 220 mm and a volume of about 500 μL. The reservoir 225R has a length of 180 mm and a volume of about 400 μL.

The reservoirs 212R, 213R, 214R, 215R, 222R, 224R, and 225R are formed in a meandering shape in which a linear recess extends in predetermined directions while being vertically and horizontally folded back. For example, regarding the reservoir 213R, the reservoir 213R is formed in a meandering shape including a plurality of (thirteen in FIG. 15) first straight portions (first flow paths) 213R1 which are arranged in parallel with a predetermined direction (a right-to-left direction in FIG. 15) and a second straight portion (second flow path) 213R2 which connects connection points between end parts of adjacent first straight portions 213R1 repeatedly and alternately at a first end side and a second end side of the first straight portion 213R1. For example, the reservoirs 212R, 214R, 215R, 222R, 224R, and 225R are formed in a meandering shape similarly to the reservoir 213R.

A first end of the reservoir 212R is connected to the cleaning solution-introduction inlet (the penetration portion) 10d penetrating the substrate 201 in the thickness direction thereof. A second end of the reservoir 212R is connected to an atmospheric open portion 20d. The atmospheric open portion 20d penetrates the substrate 201 in the thickness direction thereof. A first end of the reservoir 213R is connected to the sample-introduction inlet (the penetration portion) 10b penetrating the substrate 201 in the thickness direction thereof. A second end of the reservoir 213R is connected to an atmospheric open portion 20b. The atmospheric open portion 20b penetrates the substrate 201 in the thickness direction thereof. A first end of the reservoir 214R is connected to the second reagent-introduction inlet (the penetration portion) 10c penetrating the substrate 201 in the thickness direction thereof. A second end of the reservoir 214R is connected to an atmospheric open portion 20c. The atmospheric open portion 20c penetrates the substrate 201 in the thickness direction thereof. A first end of the reservoir 215R is connected to the first reagent-introduction inlet (the penetration portion) 10a penetrating the substrate 201 in the thickness direction thereof. A second end of the reservoir 215R is connected to an atmospheric open portion 20a. The atmospheric open portion 20a penetrates the substrate 201 in the thickness direction thereof. A first end of the reservoir 222R is connected to the transfer solution-introduction inlet (the penetration portion) 10e penetrating the substrate 201 in the thickness direction thereof. A second end of the reservoir 222R is connected to an atmospheric open portion 20e. The atmospheric open portion 20e penetrates the substrate 201 in the thickness direction thereof. A first end of the reservoir 224R is connected to the substrate solution-introduction inlet (the penetration portion) 50a penetrating the substrate 201 in the thickness direction thereof. A second end of the reservoir 224R is connected to an atmospheric open portion 60a. The atmospheric open portion 60a penetrates the substrate 201 in the thickness direction thereof. A first end of the reservoir 225R is connected to the measuring solution-introduction inlet (the penetration portion) 50b penetrating the substrate 201 in the thickness direction thereof. A second end of the reservoir 225R is connected to an atmospheric open portion 60b. The atmospheric open portion 60b penetrates the substrate 201 in the thickness direction thereof. Air holes (not shown) communicating with the atmospheric open portions 20a, 20b, 20c, 20d, 20e, 60a, and 60b are formed on the upper plate 6 to penetrate the upper plate 6 in the thickness direction thereof.

As illustrated in FIG. 15, for example, 800 μL of a cleaning solution L8 is accommodated as a solution in the reservoir 212R. For example, 300 μL of a test sample solution L1 including a sample material is accommodated as a solution in the reservoir 213R. For example, 200 μL of a second reagent solution L3 including a marker material (a detection assisting material) is accommodated as a solution in the reservoir 214R. For example, 200 μL of a first reagent solution L2 including carrier particles is accommodated as a solution in the reservoir 215R. For example, 300 μL of a transfer solution L5 is accommodated as a solution in the reservoir 222R. For example, 500 μL of a substrate solution L6 is accommodated as a solution in the reservoir 224R. For example, 400 μL of a measuring solution L7 is accommodated as a solution in the reservoir 225R. The capacities of the reservoirs can be easily adjusted by changing at least one of the width, the depth, and the length.

Since the reservoirs 212R, 213R, 214R, 215R, 222R, 224R, and 225R are formed to have a length and a cross-sectional area that satisfy Expression (10), it is possible to hold the solution in a stationary state as a continuous body even when acceleration including the gravitational acceleration is applied during storage or during transport.

For example, in a method of manufacturing the fluidic device 200, similarly to the above-described fluidic device 1, the fluidic device 200 is manufactured by forming the reservoir layer 119A and the reaction layer 119B in the substrate 201, installing various types of valves in the upper plate, and then bonding the upper plate, the lower plate, and the substrate 201 to be integrated into a stacked state by a bonding means such as adhesion. In the manufactured fluidic device 200, a predetermined solution is injected into the reservoirs 212R, 213R, 214R, 215R, 222R, 224R, and 225R via the air holes. For example, an amount of solution which is injected is about twice as much as the amount of solution which is used for detection of a sample material which will be described later. A suction pressure at the time of injection of a solution is, for example, 5 kPa.

(Mixing Method, Capturing Method, Detection Method Using Fluidic Device 200)

Next, the mixing method, the capturing method, and the detection method using the fluidic device 200 having the above-described configuration will be described. Since the fluidic device 200 includes the circulation type mixer 1d, the mixing method, the capturing method, and the detection method using the circulation type mixer 1d will be described below. In the detection method according to the present embodiment, an antigen (a sample material, a biomolecule) which is a detection target included in a test sample is detected by an immune reaction and an enzyme reaction.

(Introduction Step and Partitioning Step)

Figure 16:
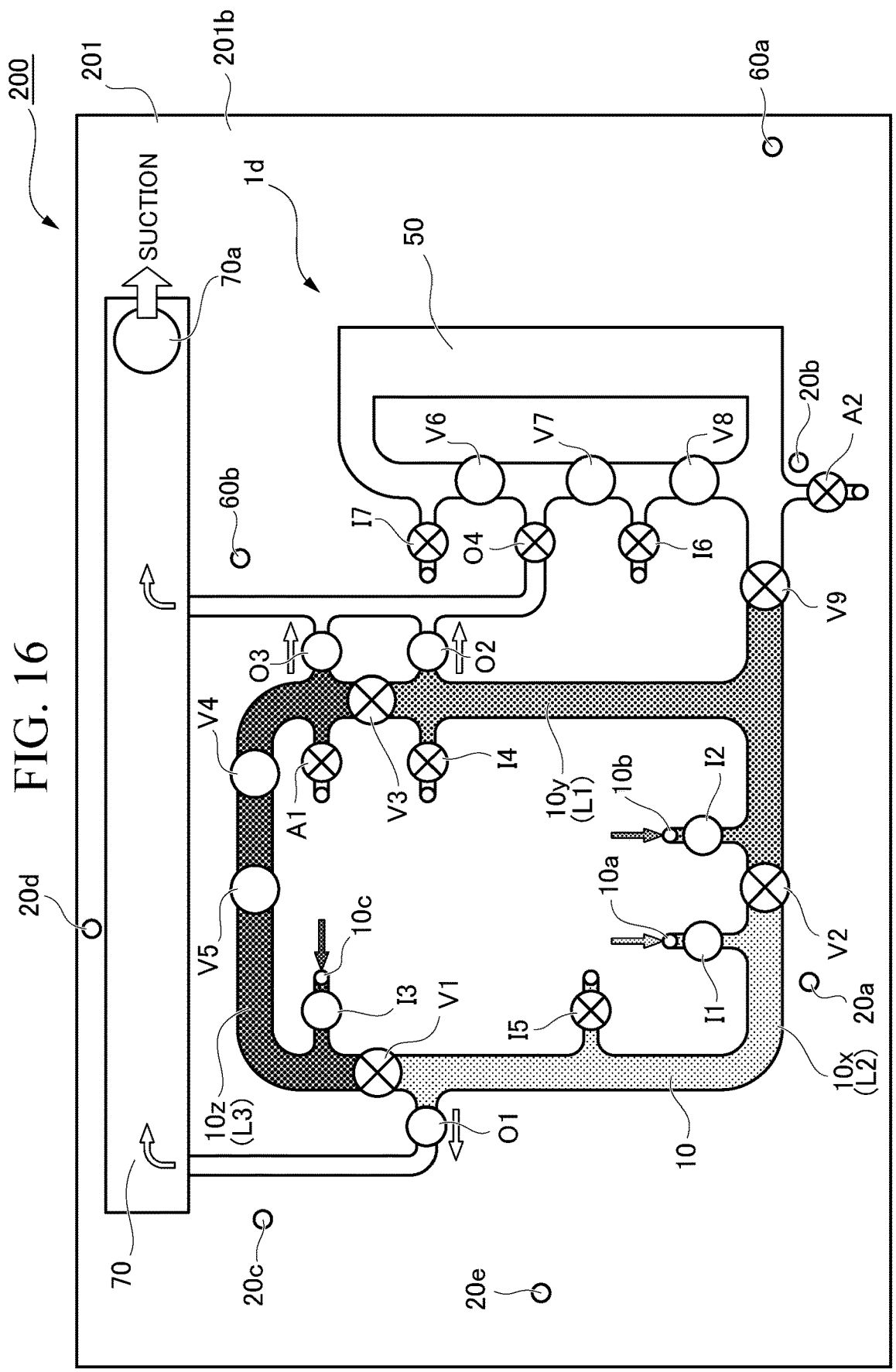
FIG. 16 is a schematic plan view of the fluidic device according to the embodiment.

First, as illustrated in FIG. 16, the first circulation flow path valve V1, the second circulation flow path valve V2, the third circulation flow path valve V3, and the introduction flow path valves I5, I4, and A1 are closed. Thereby, the circulation flow path 10 is partitioned into a flow path 10x, a flow path 10y, and a flow path 10z.

Subsequently, the first reagent solution L2 including carrier particles is introduced into the flow path 10x from the first reagent-introduction inlet 10a connected to the reservoir 215R of the reservoir layer 119A, the sample solution L1 including a sample material is introduced into the flow path 10y from the sample-introduction inlet 10b connected to the reservoir 213R, and the second reagent solution L3 including a marker material (a detection assisting material) is introduced into the flow path 10z from the second reagent-introduction inlet 10c connected to the reservoir 214R.

Introduction of the sample solution L1, the second reagent solution L3, and the first reagent solution L2 from the reservoirs 213R, 214R, and 215R is performed by performing negative-pressure suction from the outlet 70a of the waste solution tank 70 in a state in which the discharge flow path valves O1, O2, and O3 and the introduction flow path valves I2 and I3 are open. At the time of introduction of the sample solution L1, the second reagent solution L3, and the first reagent solution L2, since the reservoirs 213R, 214R, and 215R are formed of a linear recess meandering in the in-plane direction, the capillary force has a greater impact on the sample solution L, the second reagent solution L3, and the first reagent solution L2 than the acceleration which includes the gravity and which is applied to the sample solution L1, the second reagent solution L3, and the first reagent solution L2, and the sample solution L, the second reagent solution L3, and the first reagent solution L2 are held in the reservoirs 213R, 214R, and 215R by the capillary force, the sample solution L1, the second reagent solution L3, and the first reagent solution L2 can be easily introduced into the flow path 10y, the flow path Oz, and the flow path 10x without allowing bubbles remaining on the opposite sides of the solution-introduction inlets 10b, 10c, and 10a of the reservoirs 213R, 214R, and 215R to precede the solutions.

In the present embodiment, the sample solution L1 includes an antibody which is a detection target (a sample material). Examples of the sample solution include a body fluid such as blood, urine, saliva, blood plasma, or serum, a cellular extract, and a tissue-crushed solution. In the present embodiment, magnetic particles are used as carrier particles included in the first reagent solution L2. An antibody A which is specifically coupled to an antigen (a sample material) which is a detection target is fixed to the surfaces of magnetic particles. In the present embodiment, the second reagent solution L3 contains an antibody B which is specifically coupled to an antigen which is a detection target. An alkali phosphatase (a detection assisting material, an enzyme) is fixed to the antibody B to mark the antibody.

(Mixing Step)

Figure 17:
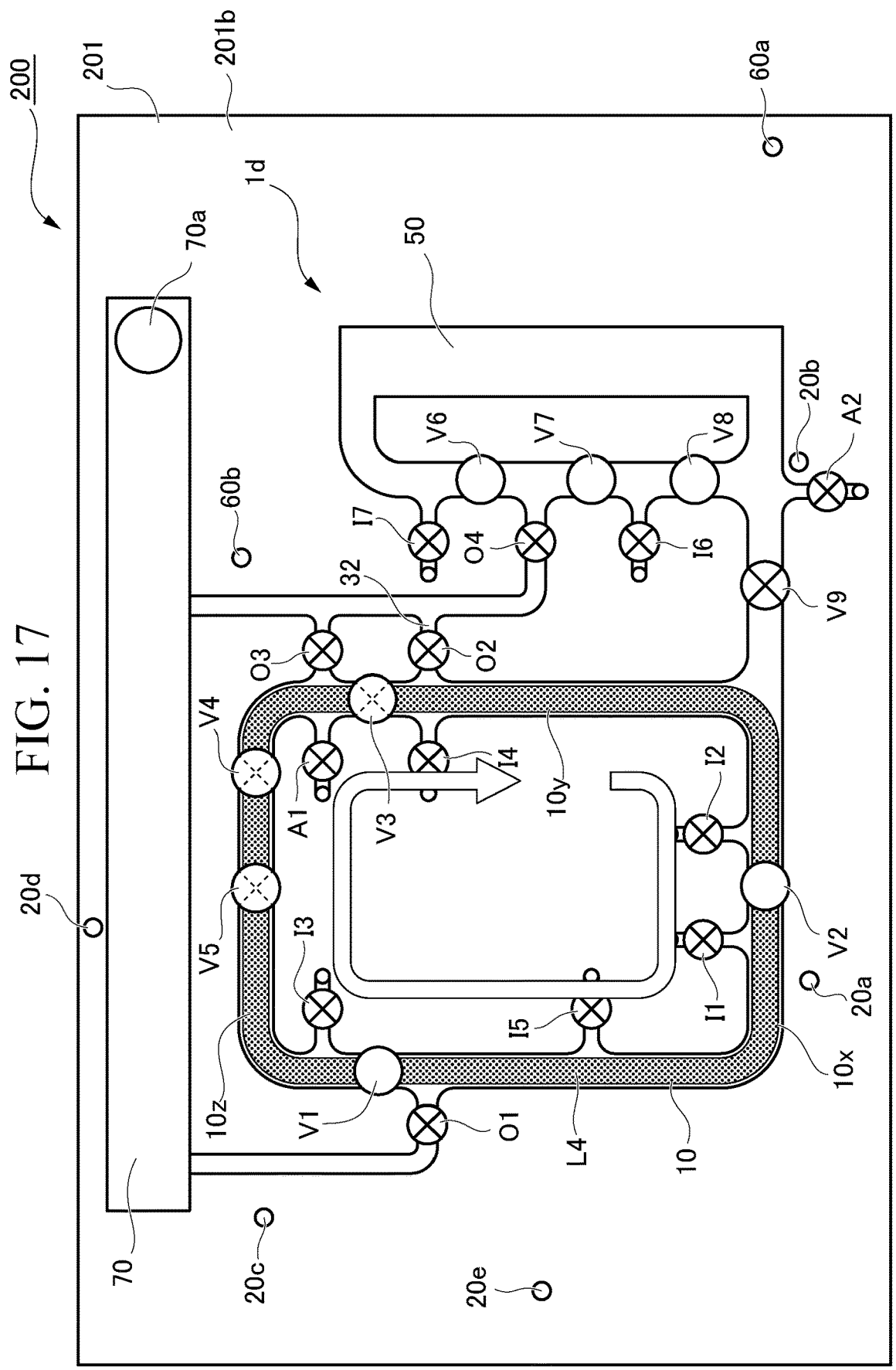
FIG. 17 is a schematic plan view of the fluidic device according to the embodiment.

Subsequently, as illustrated in FIG. 17, the introduction flow path valves I1, I2, and I3 are closed. Thereby, communication with a flow path connected to the circulation flow path 10 is cutoff, and the circulation flow path 10 is closed. The first circulation flow path valve V1, the second circulation flow path valve V2, and the third circulation flow path valve V3 are opened, the pump valves V3, V4, and V5 are operated, the first reagent solution L2 (a first reagent), the sample solution L1 (a sample), and the second reagent solution L3 (a second reagent) are circulated in the circulation flow path 10 to mix the solutions, and a mixed solution L4 is obtained. By mixing the first reagent solution L2, the sample solution L1, and the second reagent solution L3, an antigen is coupled to the antibody A fixed to the carrier particles, and the antibody B to which an enzyme is fixed is coupled to the antigen. Thereby, a carrier particle-antigen-enzyme complex (a carrier particle-sample material-detection assisting material complex, a first complex) is formed.

(Magnet Installing Step and Capturing Step)

The capture portion 40 (refer to FIG. 14) includes a magnet installing portion 41 in which a magnet that captures magnetic particles can be installed. A magnet is installed in the magnet installing portion 41 to obtain a capture available state in which the magnet is close to the circulation flow path. In this state, the pump valves V3, V4, and V5 are operated to circulate a solution including the carrier particle-antigen-enzyme complex (the first complex) in the circulation flow path 10 and to cause the capture portion 40 to capture the carrier particle-antigen-enzyme complex. The carrier particle-antigen-enzyme complex flows in one direction or two directions in the circulation flow path and circulates or reciprocates in the circulation flow path. FIG. 17 shows a state in which the carrier particle-antigen-enzyme complex circulates in one direction. The complex is captured on the inner wall surface of the circulation flow path 10 in the capture portion 40 and is separated from a liquid component.

(Cleaning Step)

The introduction flow path valve A1 and the discharge flow path valve O2 are opened, the third circulation flow path valve V3 is closed, negative-pressure suction from the outlet 70a is performed, and air is introduced into the circulation flow path 10 from the air-introduction inlet 10f via the introduction flow path 81. Thereby, a liquid component (a waste solution) separated from the carrier particle-antigen-enzyme complex is discharged from the circulation flow path 10 via the discharge flow path 32. The waste solution is stored in the waste solution tank 70. By closing the third circulation flow path valve V3, air is efficiently introduced into the entire circulation flow path 10.

Thereafter, the discharge flow path valve O2 and the third circulation flow path valve V3 are closed, the introduction flow path valve I4 and the discharge flow path valve O3 are opened, and negative-pressure suction from the outlet 70a is performed. Thereby, a cleaning solution L8 is introduced into the circulation flow path 10 from the reservoir 212R via the cleaning solution-introduction inlet 10d and the introduction flow path 24. By closing the third circulation flow path valve V3, the cleaning solution L8 is introduced into the circulation flow path 10 to fill the circulation flow path 10. At the time of introduction of the cleaning solution L8, since the reservoir 212R is formed of a linear recess meandering in the in-plane direction, the capillary force has a greater impact on the cleaning solution L8 than the acceleration which includes the gravity and which is applied to the cleaning solution L8, and the cleaning solution L8 is held in the reservoir 212R by the capillary force, the cleaning solution L8 can be easily introduced into the circulation flow path 10 without allowing bubbles remaining on the opposite side of the cleaning solution-introduction inlet 10d of the reservoir 212R to precede the solutions. Thereafter, the third circulation flow path valve V3 is opened, the introduction flow path valve I4 and the discharge flow path valve O2 are closed, the circulation flow path 10 is cut off, the pump valves V3, V4, and V5 are operated to circulate the cleaning solution L8 in the circulation flow path 10 and to clean the carrier particles.

Subsequently, the introduction flow path valve A1 and the discharge flow path valve O2 are opened, the third circulation flow path valve V3 is closed, negative-pressure suction from the outlet 70a is performed, and air is introduced into the circulation flow path 10 from the air-introduction inlet 10f via the introduction flow path 81. Thereby, the cleaning solution is discharged from the circulation flow path 10, and the antibody B which has not formed the carrier particle-antigen-enzyme complex is discharged from the circulation flow path 10. Introduction and discharge of the cleaning solution may be performed a plurality of times. By repeatedly introducing the cleaning solution, performing cleaning, and discharging the solution after cleaning, it is possible to enhance the removal efficiency of unnecessary materials.
(Transfer Step)

The introduction flow path valve I5 and the discharge flow path valve O3 are opened, the discharge flow path valve O2 and the third circulation flow path valve V3 are closed, negative-pressure suction from the outlet 70a is performed, and the transfer solution L5 is introduced into the circulation flow path 10 from the reservoir 222R via the transfer solution-introduction inlet 1e and the introduction flow path 25. The introduction flow path valve I5 and the discharge flow path valve O2 are opened, the discharge flow path valve O3 and the third circulation flow path valve V3 are closed, negative-pressure suction from the outlet 70a is performed, and the transfer solution L5 is introduced into the circulation flow path 10 from the transfer solution-introduction inlet 10e connected to the reservoir 222R via the introduction flow path 25. At the time of introduction of the transfer solution L5, since the reservoir 222R is formed of a linear recess meandering in the in-plane direction, the capillary force has a greater impact on the transfer solution L5 than the acceleration which includes the gravity and which is applied to the transfer solution L5, and the transfer solution L5 is held in the reservoir 222R by the capillary force, the transfer solution L5 can be easily introduced into the circulation flow path 10 without allowing bubbles remaining on the opposite side of the transfer solution-introduction inlet 10e of the reservoir 222R to precede the solution.

Subsequently, the third circulation flow path valve V3 is opened, the introduction flow path valve I5 and the discharge flow path valves O2 and O3 are closed, and the circulation flow path 10 is cut off. Then, the magnet is detached from the magnet installing portion 41 and is separated away from the circulation flow path to obtain a released state, and the carrier particle-antigen-enzyme complex captured on the inner wall surface of the circulation flow path 10 in the capture portion 40 is released. The pump valves V3, V4, and V5 are operated, the transfer solution is circulated in the circulation flow path 10, and the carrier particle-antigen-enzyme complex is dispersed in the transfer solution.

Figure 18:
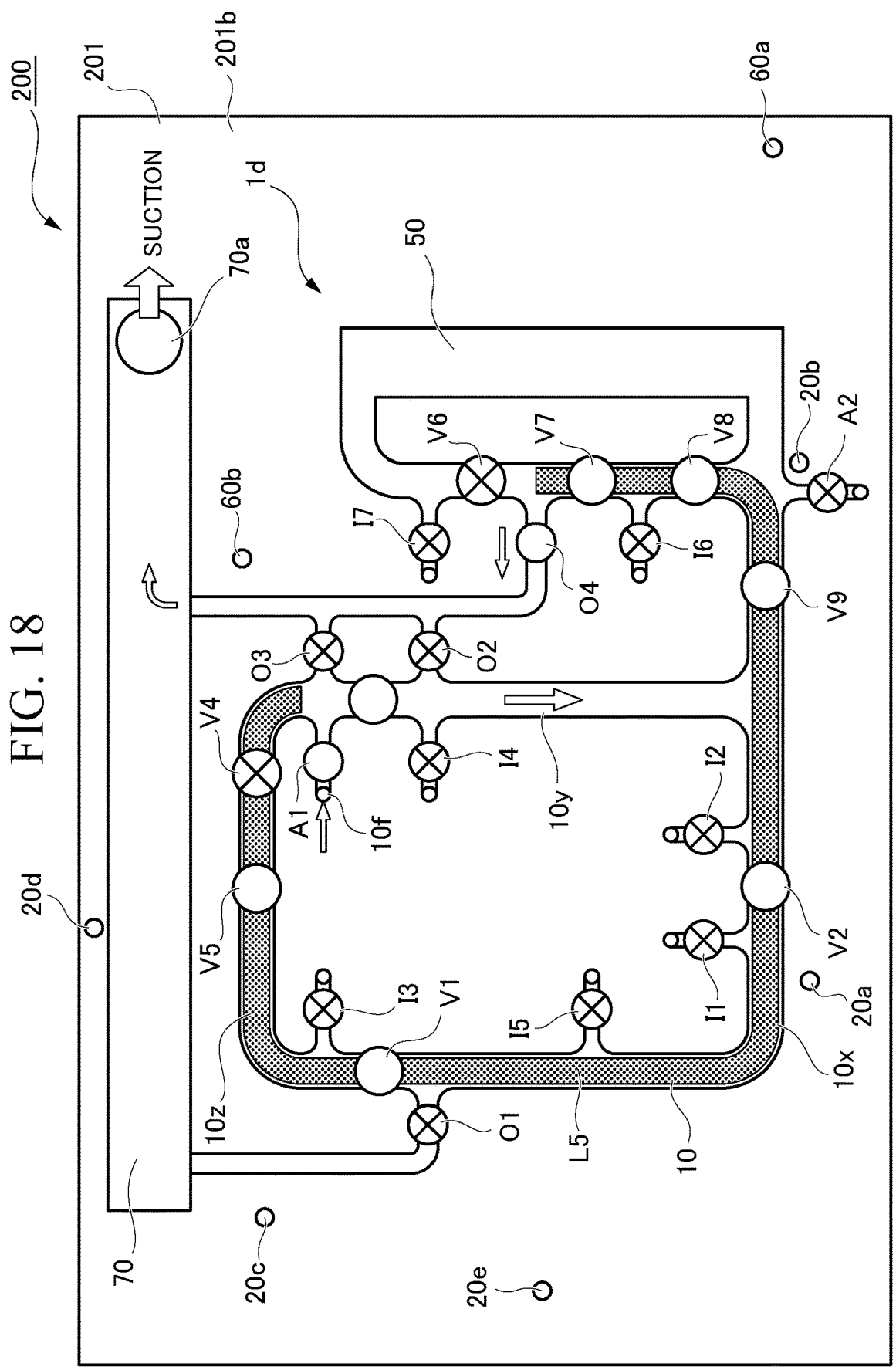
FIG. 18 is a schematic plan view of the fluidic device according to the embodiment.

Subsequently, as illustrated in FIG. 18, the introduction flow path valve A1, the connecting flow path valve V9, and the discharge flow path valve O4 are opened, negative-pressure suction from the outlet 70a is performed, and air is introduced into the circulation flow path 10 from the air-introduction inlet 10f via the introduction flow path 81. The transfer solution including the carrier particle-antigen-enzyme complex is pushed out by the air, and the transfer solution L5 is introduced into the second circulation flow path 50 via the connecting flow path 100. At this time, when the valve V6 is closed, and the transfer solution L5 reaches a connecting portion between the discharge flow path 34 and the second circulation flow path 50, the valve V7 is closed, and the second circulation flow path 50 is filled with the transfer solution. The carrier particle-antigen-enzyme complex is transferred to the second circulation flow path 50.
(Detection Step)

Figure 19:
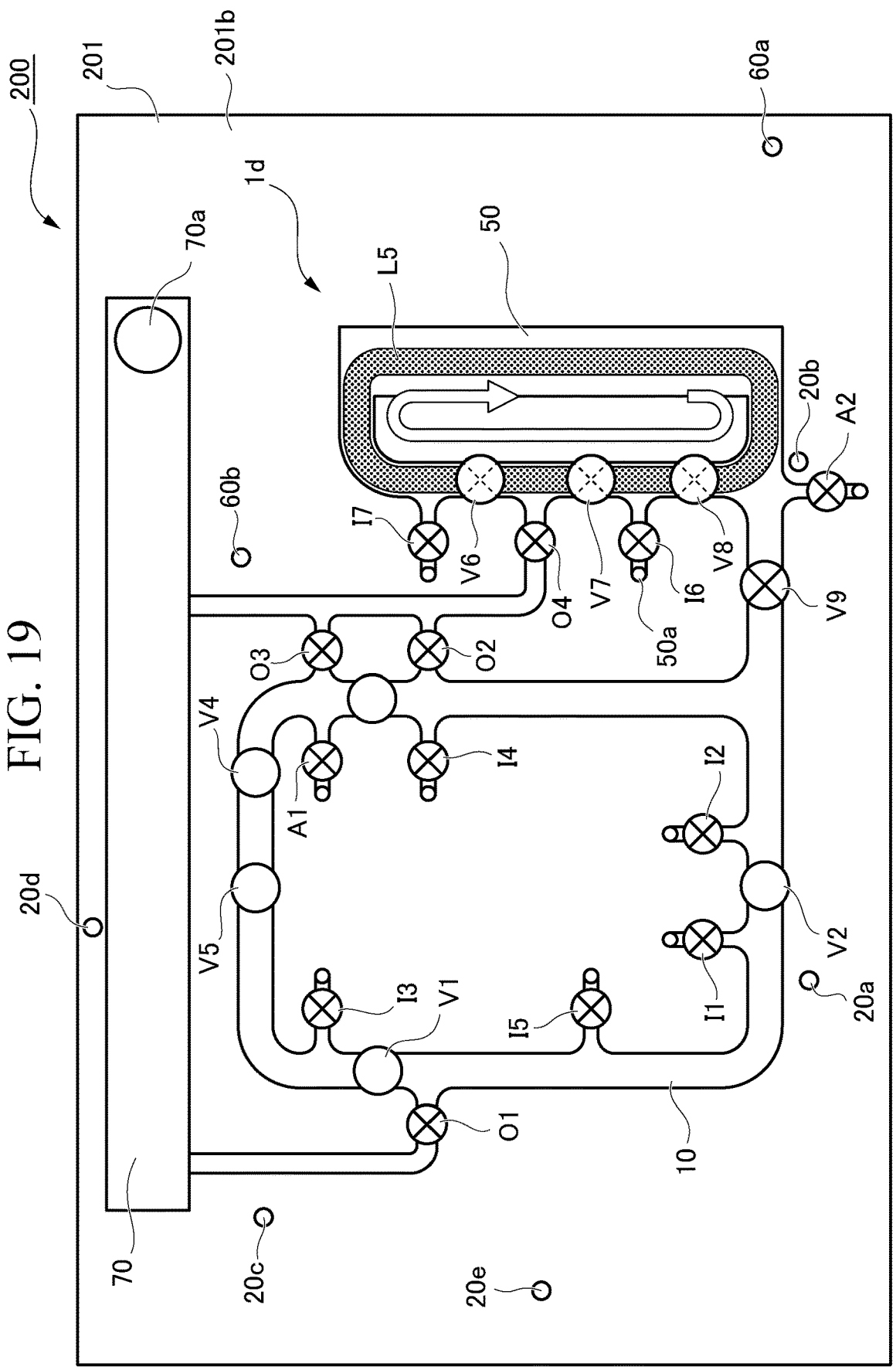
FIG. 19 is a schematic plan view of the fluidic device according to the embodiment.

After transferring of the transfer solution to the second circulation flow path 50 has been completed, as illustrated in FIG. 19, the connecting flow path valve V9 and the discharge flow path valve O4 are closed to cut off the second circulation flow path 50, the pump valves V6, V7, and V8 are operated to circulate the transfer solution L5 including the carrier particle-antigen-enzyme complex in the second circulation flow path 50, and the carrier particle-antigen-enzyme complex is captured by the capture portion 42 (refer to FIG. 14).

The introduction flow path valve A2 and the discharge flow path valve O4 are opened, negative-pressure suction from the outlet 70a is performed, and air is introduced into the second circulation flow path 50 from the air-introduction inlet 50c via the introduction flow path 82. Thereby, the liquid component (the waste solution) of the transfer solution L5 separated from the carrier particle-antigen-enzyme complex is discharged from the second circulation flow path 50 via the discharge flow path 34. The waste solution is stored in the waste solution tank 70. At this time, air is efficiently introduced into the entire second circulation flow path 50 by closing the valve V6 or V7.

The introduction flow path valve I6 and the discharge flow path valve O4 are opened, the valve V7 is closed, negative-pressure suction from the outlet 70a is performed, and the substrate solution L6 is introduced into the second circulation flow path 50 from the reservoir 224R via the substrate solution-introduction inlet 50a and the introduction flow path 26. The substrate solution L6 includes 3-(2'-spiroadamantane)-4-methoxy-4-(3"-phosphoryloxy)phenyl-1,2-dioxetane (AMPPD) or 4-Aminophenyl Phosphate (pAPP) which serves as a substrate of an alkali phosphatase (an enzyme). At the time of introduction of the substrate solution L6, since the reservoir 224R is formed of a linear recess meandering in the in-plane direction, the capillary force has a greater impact on the substrate solution L6 than the acceleration which includes the gravity and which is applied to the substrate solution L6, and the substrate solution L6 is held in the reservoir 224R by the capillary force, the substrate solution L6 can be easily introduced into the second circulation flow path 50 without allowing bubbles remaining on the opposite side of the substrate solution-introduction inlet 50a of the reservoir 224R to precede the solution.

The discharge flow path valve O4 and the introduction flow path valve I6 are closed to cut off the second circulation flow path 50, the pump valves V6, V7, and V8 are operated to circulate the substrate solution in the second circulation flow path 50, and the substrate and the enzyme of the carrier particle-antigen-enzyme complex are caused to react with each other.

Through the above-described operations (the detection method and the like), an antigen which is a detection target included in a sample can be detected as a chemiluminescent signal, an electrochemical signal, or the like. In this way, the detection portion 60 and the capture portion 42 may not be used in combination, and the capture portion is not necessarily provided in the second circulation flow path 50.

The detection method according to the present embodiment can also be applied to analysis of a biological sample, in-vitro diagnosis, or the like.

Through the procedure described above, it is possible to detect a sample material using the fluidic device 200. In the fluidic device 200 according to the present embodiment, similarly to the fluidic device 1 according to the first or second embodiment, since the reservoirs 212R, 213R, 214R, 215R, 222R, 224R, and 225R include the meandering flow path, and the first straight portion and the second straight portion are locally arranged and cross with each other, it is possible to prevent the acceleration from acting over the entire length in a direction in which the solution is displaced. Therefore, in the fluidic device 200 according to the present embodiment, by setting a length L that satisfies Expression

(10) for each straight portion, it is possible to hold the solution in a stationary state as a continuous body without depending on the attitude. As a result, in the fluidic device 200 according to the present embodiment, it becomes possible to form the reservoirs 212R, 213R, 214R, 215R, 222R, 224R, and 225R having a large cross-sectional area in comparison with a case in which the cross-sectional area A is set using the entire length of the reservoirs 212R, 213R, 214R, 215R, 222R, 224R, and 225R and Expression (10). Accordingly, in the fluidic device 1 according to the present embodiment, it is possible to hold a large amount of solution S in a stationary state as a continuous body in the reservoirs 212R, 213R, 214R, 215R, 222R, 224R, and 225R without depending on the attitude.

Further, in the fluidic device 200 according to the present embodiment, since the size of the cross-section of the reservoirs 212R, 213R, 214R, 215R, 222R, 224R, and 225R is set on the basis of the capillary length, it is possible to prevent bubbles in the reservoirs 212R, 213R, 214R, 215R, 222R, 224R, and 225R from reaching the circulation flow path 10 or the second circulation flow path 50 earlier than the solution and being mixed thereinto even when the fluidic device 1 is inclined with respect to the horizontal plane. Accordingly, in the fluidic device 200 according to the present embodiment, supply of the solution from the reservoirs 212R, 213R, 214R, 215R, 222R, 224R, and 225R to the circulation flow path 10 or the second circulation flow path 50 can be easily performed without mixing bubbles, and it is possible to improve detection accuracy of the sample material.

The present embodiment is described using an example in which the substrate solution L6 and the measuring solution L7 are introduced, circulated, and detected by the detection portion 60 as a solution which is circulated in the second circulation flow path in order to detect a sample material. However, the solutions may be one kind of solution. A plurality of quantitation sections may be provided in the second circulation flow path 50, and solutions which are introduced into and quantified in the individual sections and which are circulated and mixed may be used.

In the above embodiments, the configuration or the detection method of a fluidic device using an antigen-antibody reaction has been described above, and can also be applied to a reaction using hybridization.

While embodiments of the invention have been described above with reference to the accompanying drawings, the invention is not limited to the embodiments. All shapes, combinations, and the like of the constituent members described in the above embodiments are only examples and can be modified in various forms on the basis of a design request or the like without departing from the gist of the invention.

For example, the cross-section of each of the reservoirs 29A, 29B, 29C, 212R, 213R, 214R, 215R, 222R, 224R, and 225R in the above embodiments are rectangular, but the invention is not limited to the configuration. The cross-section may have, for example, a tapered shape which decreases in width toward the bottom surface or a circular shape as illustrated in FIG. 4. When this configuration is employed, for example, when the substrate 9 is manufactured by injection molding, it is possible to decrease mold release resistance and to improve moldability.

In the above embodiments, a configuration in which a plurality of reservoirs have the same width and the same depth has been described above, but the invention is not limited to this configuration. For example, the width and the depth of each of a plurality of reservoirs may be set to different values depending on fluid flow characteristics of a solution which is accommodated. For example, when solutions are introduced into a circulation flow path by comprehensive negative-pressure suction from the plurality of reservoirs, the width and the depth according to fluid flow characteristics (fluid flow resistance or the like) of a solution for each reservoir may be set such that different types of solutions are introduced into the circulation flow path at the same timing.

Introduction of various types of solutions into the circulation flow path from the reservoirs does not need to be performed only once but may be divisionally performed a plurality of times. When solutions are divisionally introduced a plurality of times, an amount of solution for each time can be quantified by controlling an operation time of a solution transfer pump or providing a solution sensor and detecting passing of the head of a gas-solution interface through a quantitation zone.

Figure 20:
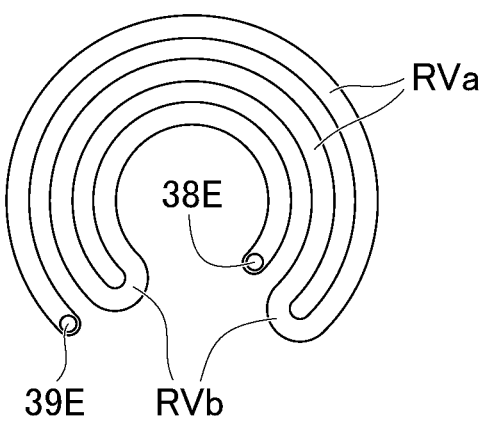
FIG. 20 is a plan view showing a modified example of a reservoir according to the embodiment.

In the above embodiments, the reservoirs 29A, 29B, 29C, 212R, 213R, 214R, 215R, 222R, 224R, and 225R have a shape in which a linear recess meanders, but may include a curved flow path which is a flow path having a non-straight shape. Examples of a reservoir including a curved flow path include a configuration in which a U-shaped, W-shaped, or C-shaped flow path is included or a configuration in which a plurality of (three in FIG. 20) first arc-shaped portion RVa which are concentrically formed and second arc-shaped portions RVb which alternately and repeatedly connect connection points of the adjacent first arc-shaped portions RVa at a first end side and a second end side in the circumferential direction of the first arc-shaped portions RVa are included, as illustrated in FIG. 20. The reservoir in this configuration connects a supply hole 39E to a penetration hole 38D, and if the cross sectional area and a gas-liquid interface distance L when the reservoir is filled with the solution satisfy Expression (10), the solution is held in a stationary state in the reservoir.

The reservoir of a curved shape is not limited to an arc shape, but may have a spiral shape in which a distance from an axis perpendicular to one surface of the substrate increases gradually with respect to the axis. Even in such a reservoir including a flow path of a curved shape which is a flow path of a non-straight shape, the size of a cross-section may be set on the basis of the capillary length, and a cross-sectional area may be set on the basis of Expression (10).

In the above embodiments, a configuration in which the reservoir layer 19A is disposed in the lower surface 9a of the substrate 9 and the reaction layer 19B is disposed in the upper surface 9b of the substrate 9 and a configuration in which the reservoir layer 119A is disposed in the lower surface 201a of the substrate 201 and the reaction layer 119B is disposed in the upper surface 201b of the substrate 201 have been described above, but the invention is not limited to the configurations. For example, when the reaction layer 19B is disposed in the upper surface 9b of the substrate 9, a configuration in which the reservoir layer is disposed in the upper surface of the lower plate 8 or a configuration in which the reservoir layer is disposed in the upper surface of the lower plate 8 and the lower surface 9a of the substrate 9 may be employed. For example, when the reservoir layer 119A is disposed in the lower surface 201a of the substrate 201, a configuration in which a reaction layer is disposed in the lower surface of the upper plate 6, a configuration in which the reaction layer is formed in a substrate other than the upper plate 6 and the substrate 201, or a configuration in which the reaction layer is disposed in the lower surface of the upper plate 6 and the upper surface 201b of the substrate 201 may be employed.

The third embodiment of the fluidic device is described using an example in which the circulation flow path 10 and the second circulation flow path 50 do not share a flow path in which a solution can circulate; however, the configuration is not limited thereto. Hereinafter, a fluidic device including circulation flow paths that share at least part of the flow path will be described.

Figure 21:
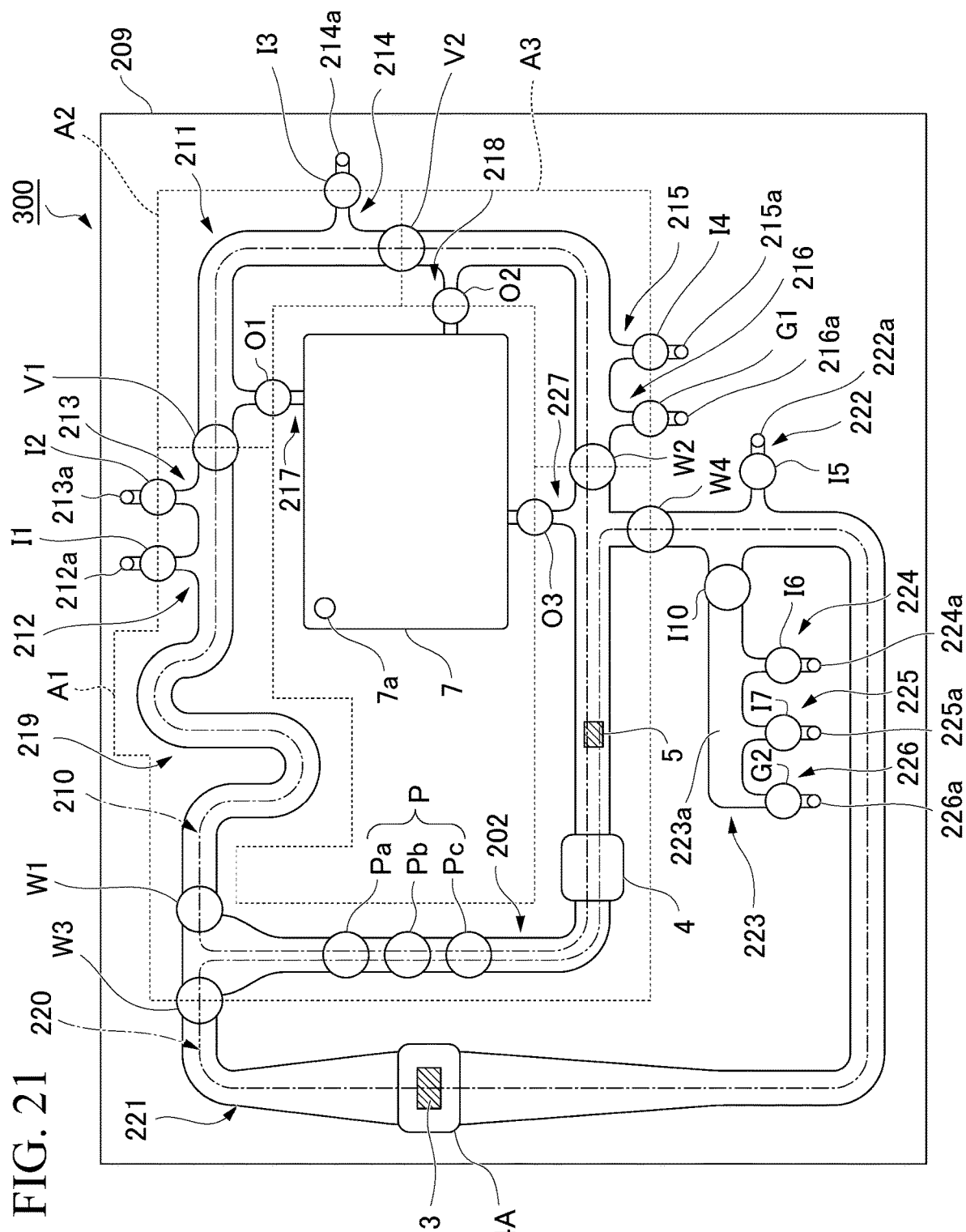
FIG. 21 is a schematic plan view of the fluidic device according to the embodiment.

FIG. 21 is a plan view schematically showing a fluidic device 300 having circulation flow paths that share part of the flow path. In the description of the present embodiment, the same reference numerals are given to the same elements as those in the above-described embodiments, and descriptions thereof will be omitted.

The fluidic device 300 includes a substrate 209 in which a flow path and a valve are formed. The fluidic device 300 includes a first circulation flow path 210 and a second circulation flow path 220 which are formed in the substrate 209 and circulate a solution containing a sample material. The first circulation flow path 210 and the second circulation flow path 220 have a shared flow path 202 which is shared with each other. The first circulation flow path 210 has a non-shared flow path 211 which is not shared with the second circulation flow path 220. The second circulation flow path 220 has a non-shared flow path 221 which is not shared with the first circulation flow path 210.

(Shared Flow Path)

The shared flow path 202 connects together end parts of the non-shared flow path 211 of the first circulation flow path 210. The shared flow path 202 connects together end parts of the non-shared flow path 221 of the second circulation flow path 220. The shared flow path 202 has a pump P, a first capture portion (capturing part) 4, and an assisting material detection portion 5.

A discharge flow path 227 connected to a waste solution tank 7 is connected to the shared flow path 202. A discharge flow path valve O3 is provided in the discharge flow path 227.

The pump P is constituted of three pump valves Pa, Pb, and Pc disposed side by side in the flow path. The pump P can control a transferring direction of the solution in the circulation flow path by controlling the opening and closing of the three pump valves Pa, Pb, and Pc. The number of valves constituting the pump valve may be 4 or more.

The assisting material detection portion 5 is provided to detect a marker material (detection assisting material) which is bound to the sample material and assists the detection of the sample material. When an enzyme is used as the marker material, degradation of the enzyme may occur as a storage time becomes longer, and detection efficiency in a detection portion 3 provided in the second circulation flow path 220 may be lowered. The assisting material detection portion 5 detects the marker material and measures the degree of degradation of the enzyme.

(First Circulation Flow Path)

The first circulation flow path 210 has a plurality of valves V1, V2, W1, and W2 in the non-shared flow path 211. Among these valves, the valves V1, V2, and W2 function as a quantitation valve. The valves W1 and W2 function as a non-shared flow path end valve. That is, the valve W2 functions not only as the quantitation valve but also as the non-shared flow path end valve.

The quantitation valves V1, V2, and W2 are disposed such that each of sections of the first circulation flow path 210 partitioned by the quantitation valves has a predetermined volume. The quantitation valves V1 and V2 partition the first circulation flow path 210 into a first quantitation section A1, a second quantitation section A2, and a third quantitation section A3.

The first quantitation section A1 includes the shared flow path 202.

Introduction flow paths 212 and 213 are connected to the non-shared flow path 211 of the first quantitation section A1. An introduction flow path 214 and a discharge flow path 217 are connected to the second quantitation section A2. An introduction flow path 215, a discharge flow path 218 and an air flow path 216 are connected to the third quantitation section A3.

The introduction flow paths 212, 213, 214 and 215 are provided to introduce different solutions into the first circulation flow path 210. An introduction flow path valve I1 that opens and closes the introduction flow path is provided in the introduction flow path 212. An introduction flow path valve I2 that opens and closes the introduction flow path is provided in the introduction flow path 213. An introduction flow path valve I3 that opens and closes the introduction flow path is provided in the introduction flow path 214. An introduction flow path valve I4 that opens and closes the introduction flow path is provided in the introduction flow path 215.

A solution introduction inlet 212a which opens on a surface of the substrate 209 is provided at an end of the introduction flow path 212. A solution introduction inlet 213a which opens on the surface of the substrate 209 is provided at an end of the introduction flow path 213. A solution introduction inlet 214a which opens on the surface of the substrate 209 is provided at an end of the introduction flow path 214. A solution introduction inlet 215a which opens on the surface of the substrate 209 is provided at an end of the introduction flow path 215.

The solution introduction inlet 212a corresponds to the cleaning solution-introduction inlet 10d illustrated in FIG. 15 and is connected to the reservoir 212R in which a cleaning solution is accommodated as a solution. The solution introduction inlet 213a corresponds to the sample-introduction inlet 10b and is connected to the reservoir 213R in which a sample solution including a sample material is accommodated as a solution. The solution introduction inlet 214a corresponds to the second reagent introduction inlet 10c and is connected to the reservoir 214R in which a second reagent solution including a marker material is accommodated as a solution. The solution introduction inlet 215a corresponds to the first reagent-introduction inlet 10a and is connected to the reservoir 215R in which a first reagent solution including carrier particles is accommodated as a solution.

Since the reservoirs 212R, 213R, 214R, and 215R are formed to have a length and a cross-sectional area that satisfy Expression (10), it is possible to hold the solution in a stationary state as a continuous body even when acceleration including the gravitational acceleration is applied during storage or during transport.

The air flow path 216 is provided to discharge air or introduce air from the first circulation flow path 210. An air flow path valve G1 that opens and closes the flow path is provided in the air flow path 216.

An air introduction inlet 216a which opens on the surface of the substrate 209 is provided at an end of the air flow path 216.

The discharge flow paths 217 and 218 are provided to discharge a solution from the first circulation flow path 210. A discharge flow path valve O1 that opens and closes the discharge flow path is provided in the discharge flow path 217. A discharge flow path valve O2 that opens and closes the discharge flow path is provided in the discharge flow path 218. The discharge flow paths 217 and 218 are connected to the waste solution tank 7. An outlet 7a which is connected to an external suction pump (not shown) and which opens on the surface of the substrate for negative pressure suction is provided in the waste solution tank 7. In the fluidic device 300 of the present embodiment, the waste solution tank 7 is disposed in an inner region of the first circulation flow path 210. Thereby, the fluidic device 300 can be miniaturized.

A meandering portion 219 is provided in the non-shared flow path 211 of the first quantitation section A1. The meandering portion 219 is part of the non-shared flow path 211 of the first quantitation section A1 and is a portion formed to meander right and left. The meandering portion 219 increases the volume of the non-shared flow path 211 of the first quantitation section A1.

(Second Circulation Flow Path)

The second circulation flow path 220 has valves W3 and W4 that function as a non-shared flow path end valve, the detection portion 3, and a second capture portion 4A in the non-shared flow path 221. The second capture portion 4A has a configuration similar to the capture portion 4 described above. The second capture portion 4A and the detection portion 3 are disposed to overlap each other.

An introduction flow path 222 and an aggregation flow path 223 are connected to the non-shared flow path 221 of the second circulation flow path 220. A solution reservoir portion 223a and a valve I10 are provided in the aggregation flow path 223. The valve I10 is located between the solution reservoir portion 223a and the second circulation flow path 220. Introduction flow paths 224 and 225 and an air flow path 226 are connected to the solution reservoir portion 223a. An introduction flow path valve I5 is provided in the course of the introduction flow path 222. An introduction flow path valve I6 is provided in the course of the introduction flow path 224. An introduction flow path valve I7 is provided in the course of the introduction flow path 225. An introduction inlet 222a is provided at an end of the introduction flow path 222. An introduction inlet 224a is provided at an end of the introduction flow path 224. An introduction inlet 225a is provided at an end of the introduction flow path 225. Similarly, an air flow path valve G2 is provided in the course of the air flow path 226. An air introduction inlet 226a is provided at an end of the air flow path 226.

The solution introduction inlet 222a corresponds to the transfer solution-introduction inlet 10e illustrated in FIG. 15 and is connected to the reservoir 222R in which a transfer solution is accommodated as a solution. The solution introduction inlet 224a corresponds to the substrate solution-introduction inlet 50a and is connected to the reservoir 224R in which a substrate solution is accommodated as a solution. The solution introduction inlet 225a corresponds to the measuring solution-introduction inlet 50b and is connected to the reservoir 225R in which a measuring solution is accommodated as a solution.

Since the reservoirs 222R, 224R, and 225R are formed to have a length and a cross-sectional area that satisfy Expression (10), it is possible to hold the solution in a stationary state as a continuous body even when acceleration including the gravitational acceleration is applied during storage or during transport.

(Detection Method)

Next, the mixing method, the capturing method, and the detection method of a sample material using the fluidic device 300 according to the present embodiment will be described. In the detection method according to the present embodiment, an antigen (a sample material, a biomolecule) which is a detection target included in a test sample is detected by an immune reaction and an enzyme reaction.

First, the valves V1, V2, and W2 of the first circulation flow path 210 are closed, the valve W1 is opened, and the non-shared flow path end valves W3 and W4 of the second circulation flow path 220 are closed. Thereby, the first circulation flow path 210 is partitioned into the first quantitation section A1, the second quantitation section A2, and the third quantitation section A3.

Next, a sample solution including a sample material is introduced into the first quantitation section A1 from the introduction flow path 213 (sample solution introduction step). Further, a second reagent solution including a marker material (a detection assisting material) is introduced into the second quantitation section A2 from the introduction flow path 214 (second reagent solution introduction step), and a first reagent solution including carrier particles is introduced into the third quantitation section A3 from the introduction flow path 215 (first reagent solution introduction step).

Next, by opening the valves V1, V2, and W2 and driving the pump P of the shared flow path 202, the sample solution, the first reagent solution, and the second reagent solution are circulated in the first circulation flow path 210 to mix the solutions, and a mixed solution is obtained (first circulation step). By mixing the sample solution, the first reagent solution, and the second reagent solution, an antigen is coupled to the antibody A fixed to the carrier particles, and the antibody B to which an enzyme is fixed is coupled to the antigen. Thereby, a carrier particle-antigen-enzyme complex is generated in the mixed solution.

Further, in the first circulation step, an excess marker material that does not form the carrier particle-antigen-enzyme complex is captured by the assisting material detection portion 5.

Further, after the binding between the sample material and the carrier particles is sufficiently advanced, the magnet that captures magnetic particles in the first capture portion 4 is brought close to the flow path while circulating the mixed solution in the first circulation flow path 210. Thereby, the first capture portion 4 captures the carrier particle-antigen-enzyme complex. The complex is captured on an inner wall surface of the first circulation flow path 210 in the first capture portion 4 and is separated from the liquid component.

Next, while the carrier particle-antigen-enzyme complex is captured in the first capture portion 4, the air flow path valve G1 and the discharge flow path valves O1, O2 and O3 are opened, the negative pressure suction from the outlet 7a of the waste solution tank 7 is performed, and the liquid component is discharged (mixed solution discharge step). Thereby, in the shared flow path 202, the mixed solution is removed, and the carrier particle-antigen-enzyme complex is separated from the mixed solution.

Next, the air flow path valve G1 and the discharge flow path valves O1, O2, and O3 are closed, and the cleaning solution is introduced from the introduction flow path 212 into the first circulation flow path 210. Further, by driving the pump P of the shared flow path 202, the cleaning solution is circulated in the first circulation flow path 210, and the carrier particle-antigen-enzyme complex is cleaned. Further, after the circulation of the cleaning solution for a certain period of time is completed, the cleaning solution is discharged to the waste solution tank 7.

A cycle of introduction, circulation and discharge of the cleaning solution may be performed a plurality of times. By repeatedly performing the introduction, circulation and discharge of the cleaning solution, it is possible to enhance the removal efficiency of unnecessary materials.

Next, the valves W1 and W2 of the first circulation flow path 210 are closed, the non-shared flow path end valves W3 and W4 of the second circulation flow path 220 are opened, a transfer solution is introduced from the introduction flow path 222, and the second circulation flow path 220 is filled with the transfer solution. Next, the capturing of the carrier particle-antigen-enzyme complex in the first capture portion 4 is released, and the carrier particle-antigen-enzyme complex is transferred to the second circulation flow path 220 by driving the pump P. Further, while driving the pump P, the magnet that captures the magnetic particles is brought close to the flow path in the second capture portion 4A, and the carrier particle-antigen-enzyme complex is captured. Thereby, the carrier particle-antigen-enzyme complex is captured on the inner wall surface of the second capture portion 4A and is separated from the liquid component. It is possible to perform detection by a clean flow path without contamination due to the sample material or the like by moving the carrier particle-antigen-enzyme complex from the capture portion 4 to the capture portion 4A.

Next, the valve W4 is closed, the air flow path valve G2 of the air flow path 226 and the discharge flow path valve O3 of the discharge flow path 227 are opened, and the negative pressure suction from the outlet 7a is performed. Thereby, the liquid component (waste solution) of the transfer solution separated from the carrier particle-antigen-enzyme complex is discharged from the second circulation flow path in a clockwise direction.

Next, the non-shared flow path end valves W3 and W4 of the second circulation flow path 220 are opened, a substrate solution is introduced from the introduction flow path 224, and the second circulation flow path 220 is filled with the substrate solution (substrate solution introduction step). Next, by driving the pump P, the carrier particle-antigen-enzyme complex captured by the second capture portion 4A reacts with the substrate solution. Further, after the reaction is sufficiently completed, the substrate solution is discharged from the second circulation flow path 220 through a procedure similar to that of the transfer solution.

For example, when the enzyme is alkaline phosphatase (enzyme), the substrate solution contains 3-(2'-spiroadamantane)-4-methoxy-4-(3"-phosphoryloxy) phenyl-1, 2-dioxetane (AMPPD), 4-aminophenyl phosphate (pAPP), or the like as a substrate. The substrate solution reacts with the enzyme of the carrier particle-antigen-enzyme complex in the second circulation flow path 220. By circulating the substrate solution and the carrier particle-antigen-enzyme complex in the second circulation flow path 220, the reaction with the enzyme of the carrier particle-antigen-enzyme complex is performed, and a metal can be deposited on the detection portion 3.

Next, the non-shared flow path end valves W3 and W4 of the second circulation flow path 220 are opened, a measuring solution is introduced from the introduction flow path 225, and the second circulation flow path 220 is filled with the measuring solution (measuring solution introduction step). The measuring solution contains a strong electrolytic solution or the like as a material which has a function of enhancing a signal. Next, the measuring solution is circulated in the second circulation flow path 220 by driving the pump P, and an amount of metal deposited on the detection portion 3 is electrically analyzed by an electrode of the detection portion 3.

On the other hand, the assisting material detection portion 5 measures an excess marker material captured in the first circulation step by coming into contact with the measuring solution. The detection efficiency of the marker material can be confirmed by checking a detection result in the assisting material detection portion 5.

In the present embodiment, the amount of metal generated as a result of the reaction between the enzyme and the substrate is detected. However, a color generated as a result of the reaction between the enzyme and the substrate may be detected in the detection portion.

Through the procedure described above, the sample material can be detected by the fluidic device 300.

The present embodiment is described using a case in which as a solution (a third solution) that is circulated in the second circulation flow path for detecting the sample material, the substrate solution and the measuring solution are each introduced and circulated, and the detection is performed by the detection portion 3. However, the third liquid may be one type of solution. Further, a plurality of quantitation sections may be provided in the second circulation flow path 220, and a liquid which is introduced, quantified, circulated, and mixed in each of the sections may be used as the third solution.

As shown in FIG. 21, a system 207 in one embodiment of the present invention includes the fluidic device 300 and a control part 208. The control part 208 is connected to a valve provided in the fluidic device 300 via a connection line (not shown) and controls the opening and closing of the valve. According to the system 207 of the present embodiment, mixing, capturing, and detection in the fluidic device 300 can be performed.

According to the fluidic device 300 of the present embodiment, even in a configuration including the first circulation flow path and the second circulation flow path that share part of the flow path, since the configuration includes the reservoirs 212R, 213R, 214R, 215R, 222R, 224R, and 225R described above, it is possible to achieve the advantages according to the first to third embodiments described above.

Next, with reference to FIG. 22, as a fluidic device that includes circulation flow paths which share at least part of the flow path, a fluidic device 400 will be described that includes a first type continuous circulation flow path which is configured to be able to circulate a solution in a first circulation flow path and then circulate the solution in a second circulation flow path; and a second type continuous circulation flow path which is formed of a third circulation flow path and a fourth circulation flow path and which is configured to be able to circulate a solution in the third circulation flow path and then circulate and mix the solution in both of the third and fourth circulation flow paths.

Figure 22:
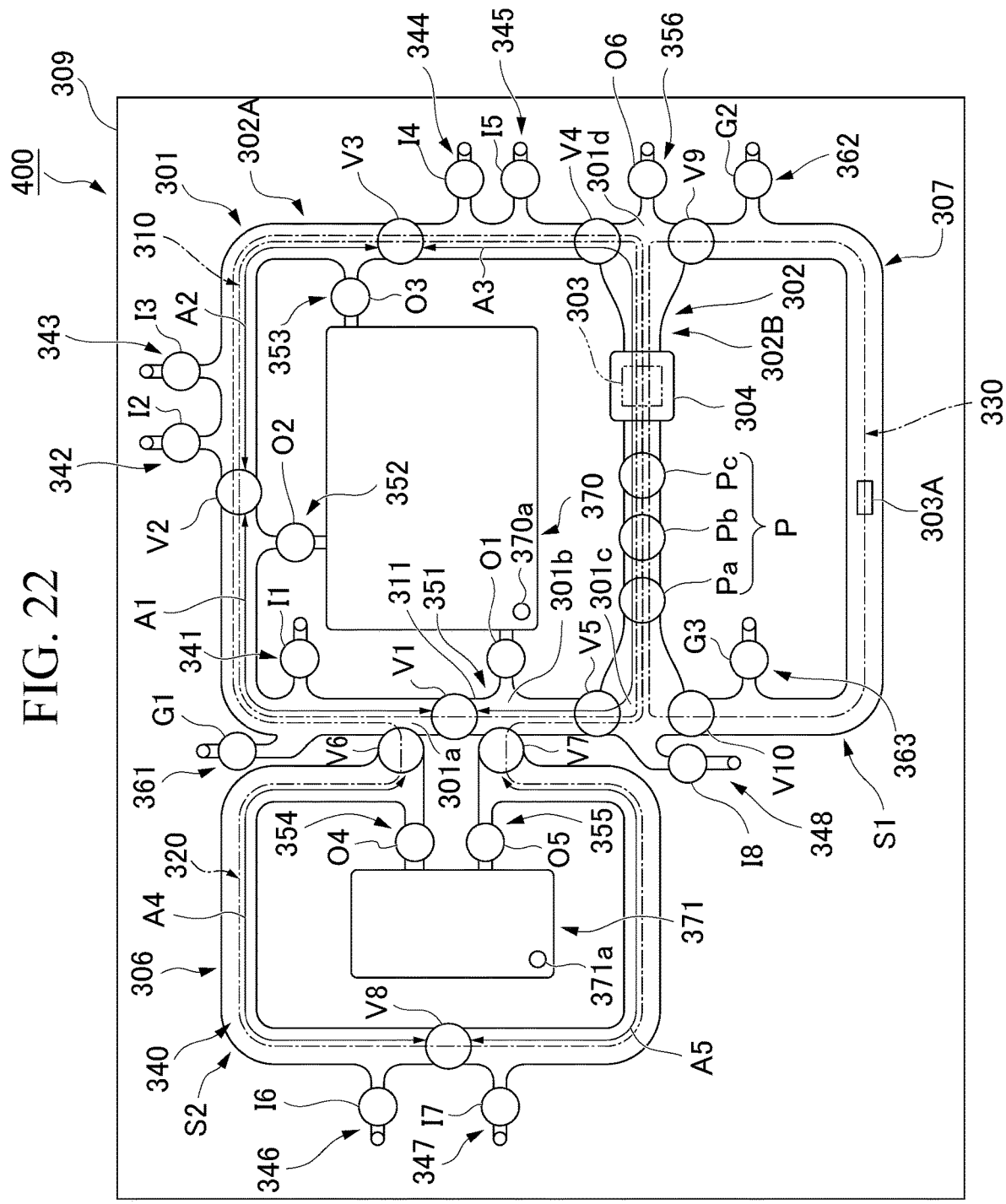
FIG. 22 is a schematic plan view of the fluidic device according to the embodiment.

FIG. 22 is a plan view schematically showing the fluidic device 400 having circulation flow paths that share part of the flow path. In the description of the present embodiment, the same reference numerals are given to the same elements as those in the above-described embodiments, and descriptions thereof will be omitted.

The flow path formed in a substrate 309 of the fluidic device 400 is classified into a loop flow path 301 which is formed in a closed loop shape, a first bypass flow path 306 which bypasses a pair of connection portions 301a and 301b of the loop flow path 301, and a second bypass flow path 307 which bypasses a pair of connection portions 301c and 301d of the loop flow path 301. A waste solution tank 370 is provided inside the loop flow path 301. A waste solution tank 371 is provided inside the first bypass flow path 306.

The loop flow path 301, the first bypass flow path 306, and the second bypass flow path 307 form a first circulation flow path 310, a second circulation flow path 320, a third circulation flow path 330, and a fourth circulation flow path 340. That is, the fluidic device 400 includes the first circulation flow path 310, the second circulation flow path 320, the third circulation flow path 330, and the fourth circulation flow path 340.

The first circulation flow path 310 is formed of the loop flow path 301. That is, the first circulation flow path 310 includes the entire loop flow path 301.

The second circulation flow path 320 is formed of part of the loop flow path 301 and the first bypass flow path 306. In the present embodiment, part of the loop flow path 301 included in the second circulation flow path 320 is one flow path having a long span among two flow paths divided by the pair of connection portions 301a and 301b in the loop flow path 301.

The third circulation flow path 330 is formed of part of the loop flow path 301 and the second bypass flow path 307. In the present embodiment, part of the loop flow path 301 included in the third circulation flow path 330 is one flow path having a short span among two flow paths divided by the pair of connection portions 301c and 301d in the loop flow path 301.

The fourth circulation flow path 340 is formed of part of the loop flow path 301 and the first bypass flow path 306. In the present embodiment, part of the loop flow path 301 included in the fourth circulation flow path 340 is a partial flow path 311 of the loop flow path 301 which is not included in the second circulation flow path 320 and the third circulation flow path 330. The partial flow path 311 is one flow path having a short span among the two flow paths divided by the pair of connection portions 301a and 301b to which the first bypass flow path 306 is connected in the loop flow path 301. The fourth circulation flow path 340 shares the first bypass flow path 306 with the second circulation flow path 320. In the present embodiment, the fourth circulation flow path 340 alone does not circulate a liquid and is mainly used for quantifying a solution. More specifically, as will be described in the description of a detection method later, the fourth circulation flow path 340 is provided to quantify and circulate a solution in the first circulation flow path 310 and then circulate and mix solutions in both circulation flow paths of the first circulation flow path 310 and the fourth circulation flow path 340. The first circulation flow path 310 and the fourth circulation flow path 340 are connected together and thereby form the second circulation flow path 320. A valve V1 may be disposed between the connection portions 301a and 301b (the short one, that is, the partial flow path 311) in the loop flow path 301 and may be closed when a liquid is circulated in the second circulation flow path 320. Thereby, the liquid can flow in one direction in the second circulation flow path 320.

In the loop flow path 301, by disposing valves in the vicinities of the connection portions 301a and 301b in the long one of the two flow paths divided by the connection portions 301a and 301b and closing these valves, the fourth circulation flow path 340 alone may circulate the liquid.

The first circulation flow path 310 and the fourth circulation flow path 340 form a second continuous circulation flow path (a second type continuous circulation flow path) S2. The second circulation flow path 320 and the third circulation flow path 330 have a flow path (a second shared flow path 302B) shared with each other. The second circulation flow path 320 and the third circulation flow path 330 are configured to be able to circulate a solution in the second circulation flow path 320 and then circulate the solution in the third circulation flow path 330. The second circulation flow path 320 and the third circulation flow path 330 form a first continuous circulation flow path (a first type continuous circulation flow path) S1.

The first circulation flow path 310 and the second circulation flow path 320 have a first shared flow path 302A shared with each other. The first circulation flow path 310 and the third circulation flow path 330 have a flow path (the second shared flow path 302B) shared with each other. The first shared flow path 302A and the second shared flow path 302B share at least part of the flow paths (an overlapping shared flow path 302). In the present embodiment, the entire length of the second shared flow path 302B overlaps the entire length of the overlapping shared flow path 302.

A continuous circulation flow path is classified into the first type continuous circulation flow path and the second type continuous circulation flow path. The first type continuous circulation flow path is formed of two circulation flow paths and is configured to be able to circulate a solution in one circulation flow path and then circulate the solution in another circulation flow path. The second type continuous circulation flow path is formed of two circulation flow paths and is configured to be able to circulate a solution in one circulation flow path and then circulate and mix solutions in both circulation flow paths. The other flow path in the second type continuous circulation flow path may be sufficient as long as it can circulate both the liquid contained therein and the liquid contained in the one circulation flow path together, and may not be configured to circulate a liquid independently.

The fluidic device of the embodiment includes at least two continuous circulation flow paths selected from a group consisting of the first type continuous circulation flow path and the second type continuous circulation flow path. Accordingly, when the fluidic device of the present embodiment includes two continuous circulation flow paths, the fluidic device may be any of one including two first type continuous circulation flow paths, one including two second type continuous circulation flow paths, and one including one first type continuous circulation flow path and one second type continuous circulation flow path. When the fluidic device of the present embodiment includes three or more continuous circulation flow paths, all of the continuous circulation flow paths may be the first type continuous circulation flow path or may be the second type continuous circulation flow path, or the fluidic device may include both of the first type and second type continuous circulation flow paths.

In the fluidic device of the present embodiment, two or more continuous circulation flow paths may share a circulation flow path. For example, when the fluidic device of the present embodiment includes the first type continuous circulation flow path and the second type continuous circulation flow path, one circulation flow path of the first type continuous circulation flow path may be used as one circulation flow path of the second type continuous circulation flow path.

The first continuous circulation flow path S1 is formed of two circulation flow paths (the second circulation flow path 320 and the third circulation flow path 330). The first continuous circulation flow path S1 is configured to be able to circulate a solution in one circulation flow path (the second circulation flow path 320) and then circulate the solution in another circulation flow path (the third circulation flow path 330). Accordingly, the first continuous circulation flow path S1 is classified as the first type continuous circulation flow path. The two circulation flow paths (the second circulation flow path 320 and the third circulation flow path 330) in the first continuous circulation flow path S1 share part of the flow paths (the second shared flow path 302B).

The second continuous circulation flow path S2 is formed of two circulation flow paths (the first circulation flow path 310 and the fourth circulation flow path 340). The second continuous circulation flow path S2 is configured to circulate a solution in one circulation flow path (the first circulation flow path 310) and then circulate and mix solutions in both circulation flow paths (that is, the second circulation flow path 320) of the first circulation flow path 310 and the fourth circulation flow path 340. Accordingly, the second continuous circulation flow path S2 is classified as the second type continuous circulation flow path.

(First Circulation Flow Path)

A plurality of valves V1, V2, V3, V4, and V5 are provided in the first circulation flow path 310. Among the plurality of valves V1, V2, V3, V4, and V5, the valves V1, V2, and V3 function as a quantitation valve, and the valves V4 and V5 function as a shared flow path end valve which partitions the overlapping shared flow path 302 from other areas.

A capture portion 304 and a pump P are disposed in the overlapping shared flow path 302 of the first circulation flow path 310.

The quantitation valves V1, V2, and V3 divide the first circulation flow path 310 into a first quantitation section A1, a second quantitation section A2, and a third quantitation section A3. That is, the quantitation valves V1 V2, and V3 are arranged such that each of the sections of the first circulation flow path 310 delimited by the quantitation valves has a predetermined volume. More specifically, the first quantitation section A1 is formed between the quantitation valves V1 and V2. The second quantitation section A2 is formed between the quantitation valves V2 and V3. The third quantitation section A3 is formed between the quantitation valves V1 and V3.

An introduction flow path 341, a discharge flow path 352, and an air flow path 361 are connected to the first quantitation section A1 of the first circulation flow path 310. Introduction flow paths 342 and 343 and a discharge flow path 353 are connected to the second quantitation section A2. Introduction flow paths 344, 345, and 348, a discharge flow path 351, and a discharge flow path (a recovery flow path) 356 are connected to the third quantitation section A3. Specifically, the introduction flow path 348 and the discharge flow path 356 are disposed at both ends of the overlapping shared flow path 302 in the third quantitation section A3.

The shared flow path end valves V4 and V5 partition the first circulation flow path 310 into the overlapping shared flow path 302 and other areas. The shared flow path end valves V4 and V5 are positioned at both ends of the overlapping shared flow path 302 in the first circulation flow path 310. Both the shared flow path end valves V4 and V5 are positioned in the third quantitation section A3. The entire area of the overlapping shared flow path 302 is included in the third quantitation section A3 of the first circulation flow path 310.

(Second Circulation Flow Path)

The second circulation flow path 320 has the first shared flow path 302A which is shared with the first circulation flow path 310, and the first bypass flow path 306 which is not shared with the first circulation flow path 310.

The plurality of valves V1, V2, V3, V4, and V5 described above are provided in the first shared flow path 302A. Part of the first shared flow path 302A overlaps the overlapping shared flow path 302.

Accordingly, the first shared flow path 302A has the capture portion 304 and the pump P. The introduction flow paths 341, 342, 343, 344, 345, and 348, the discharge flow paths 351, 352, 353, and 356, and the air flow path 361 are connected to the first shared flow path 302A.

A plurality of valves V6, V7, and V8 are provided in the first bypass flow path 306. Among the plurality of valves V6, V7, and V8, the valves V6 and V7 are positioned at ends of the first bypass flow path 306 and function as first bypass flow path end valves which partition the first bypass flow path 306 and the first shared flow path 302A. The valve V8 functions as a quantitation valve. The quantitation valve V8 partitions the first bypass flow path 306 into two regions having a predetermined volume. In the first bypass flow path 306, a fourth quantitation section A4 is formed between the quantitation valve V8 and the first bypass flow path end valve V6. In the first bypass flow path 306, a fifth quantitation section A5 is formed between the quantitation valve V8 and the first bypass flow path end valve V7. An introduction flow path 346 and a discharge flow path 354 are connected to vicinities of both ends of the fourth quantitation section A4. Similarly, an introduction flow path 347 and a discharge flow path 355 are connected to vicinities of both ends of the fifth quantitation section A5.

(Third Circulation Flow Path)

The third circulation flow path 330 has a second shared flow path 302B which is shared with the first circulation flow path 310 and the second bypass flow path 307 which is not shared with the first circulation flow path 310.

As described above, the entire area of the second shared flow path 302B coincides with the overlapping shared flow path 302. Accordingly, the capture portion 304 and the pump P are disposed in the second shared flow path 302B. Valves V9 and V10 are provided at both ends of the second shared flow path 302B in the third circulation flow path 330. The valves V9 and V10 function as a shared flow path end valve. That is, the shared flow path end valves V9 and V10 partition the third circulation flow path 330 into the second shared flow path 302B and the second bypass flow path 307.

Air flow paths 362 and 363 are connected to vicinities of both ends of the second bypass flow path 307. A detection portion 303A is provided in the second bypass flow path 307.

(Capture Portion)

The capture portion 304 captures and collects a sample material in a solution that circulates in the first circulation flow path 310. The capture portion 304 is a configuration similar to the capture portions 40 and 42 and the first capture portion 4 described above.

(Detection Portion)

The detection portion 303A is provided for detecting a sample material. The detection portion 303A can detect the sample material by detecting the marker material described above. The detection portion 303A may be one that optically detects the sample material and can have a configuration, for example, in which an object lens or an imaging part can be disposed in the vicinity thereof. The imaging part may include, for example, an EMCCD (Electron Multiplying Charge Coupled Device) camera. The detection portion 303A may be one that electrochemically detects the sample material and can have a configuration, for example, in which an electrode can be disposed in the vicinity thereof.

(Introduction Flow Path)

The introduction flow paths 341 to 348 are provided for introducing a different solution into each of the first circulation flow path 310, the second circulation flow path 320, or the third circulation flow path 330. Introduction flow path valves I1 to I8 that open and close the introduction flow path is provided in the introduction flow paths 341 to 348, respectively. A solution introduction inlet which opens on a surface of the substrate 309 is provided at ends of the introduction flow paths 341 to 348. Each solution introduction inlet is formed in a length and a cross-sectional area that satisfy Expression (10) as described above and is connected to a reservoir (not shown) that accommodates a solution introduced to each of the introduction flow paths 341 to 348.

(Discharge Flow Path)

The discharge flow paths 351 to 356 are provided for discharging a solution from the first circulation flow path 310, the second circulation flow path 320, or the third circulation flow path 330. Discharge flow path valves O1 to O6 that open and close the discharge flow path are provided in the discharge flow paths 351 to 356, respectively. Among the discharge flow paths 351 to 356, the discharge flow path 356 connected to a first end of the overlapping shared flow path 302 functions as a recovery flow path that recovers the reacted solution. Accordingly, a recovery tank (not shown) is connected to an end of the discharge flow path (recovery flow path) 356. The other discharge flow paths 351 to 355 are connected to a waste solution tank 371 or a waste solution tank 372. Outlets 371a and 372a which are connected to an external suction pump (not shown) and which open on the surface of the substrate for performing negative pressure suction are provided on the waste solution tank 371 and 372.

(Air Flow Path)

The air flow paths 361 to 363 are provided for introducing or discharging air from the first circulation flow path 310. Air flow path valves G1, G2, and G3 that open and close the flow path are provided in the air flow paths 361 to 363. Air introduction inlets which open on the surface of the substrate 309 are provided at ends of the air flow paths 361 to 363. Among the air flow paths 361 to 363, the air flow path 363 functions as an air discharge flow path for suctioning air. The other air flow paths 361 and 362 function as an air introduction flow path for introducing air into the flow path and pushing out the liquid in the flow path.

(Purification Method and Detection Method)

Next, a purification method and a detection method of a sample material using the fluidic device 400 of the present embodiment will be described. According to the present embodiment, the nucleic acid can be purified and detected from a sample solution such as blood.

First, the quantitation valves V1, V2, and V3 of the first circulation flow path 310, the valves V6 and V7 positioned at end parts of the first bypass flow path 306, and the valves V9 and V10 positioned at end parts of the second bypass flow path 307 are closed. Thereby, the first circulation flow path 310 is partitioned into the first quantitation section A1, the second quantitation section A2, and the third quantitation section A3.

Next, a sample solution (solution) including a sample material is introduced from the introduction flow path 341 into the first quantitation section A1, a first reagent solution is introduced from the introduction flow path 342 into the second quantitation section A2, and a second reagent solution (pretreatment solution) is introduced from the introduction flow path 344 into the third quantitation section A3. That is, the solution (sample solution) including the sample material, the first reagent solution, and the second reagent solution are introduced into the circulation flow path (the first circulation flow path 310) ahead of the second continuous circulation flow path S2. The first reagent solution and the second reagent solution may be filled in advance in the second quantitation section A2 and the third quantitation section A3, respectively.

In the present embodiment, the sample solution is, for example, blood, serum, or plasma and includes nucleic acid as the sample material.

In the present embodiment, the first reagent solution is, for example, a solution of proteinase K. Proteinase K inactivates enzymes (nucleases) that degrade the nucleic acid. Thereby, it is possible to prevent the nucleic acid extracted from the sample solution L1 from being decomposed by the action of the enzyme.

In the present embodiment, the second reagent liquid is a cell lysis solution for extracting the nucleic acid from blood, serum or plasma contained in the sample solution.

Next, by opening the valves V1, V2, and V3 to make the first circulation flow path 310 to be a continuous loop and then driving the pump P, the sample solution, the first reagent solution, and the second reagent solution are circulated and mixed in the first circulation flow path 310, and a first mixed solution is obtained. By mixing the sample solution, the first reagent solution, and the second reagent solution, the nucleic acid which is the sample material is extracted.

Next, V6, V7, and V8 in the second circulation flow path 320 are closed, and the second circulation flow path 320 is partitioned into the fourth quantitation section A4 and the fifth quantitation section A5. Next, a third reagent solution (third solution) that includes carrier particles and that binds to the sample material is introduced from the introduction flow path 346 into the fourth quantitation section A4, and a fourth reagent solution is introduced from the introduction flow path 347 into the fifth quantitation section A5. The third reagent solution and the fourth reagent solution may be filled in advance in the fourth quantitation section A4 and the fifth quantitation section A5, respectively.

In the present embodiment, magnetic particles (for example, silica magnetic particles) are used as the carrier particles included in the third reagent solution (third solution). The silica magnetic particles bind (adsorb) to the nucleic acid (sample material) in alcohol.

In the present embodiment, the fourth reagent solution is, for example, an isopropanol solution. Isopropanol creates an alcoholic environment and forms an environment in which the magnetic particles can bind to the nucleic acid.

Next, the valves V6, V7, and V8 are opened and the valve V1 is closed to make the second circulation flow path 20 to be a continuous loop, and then the pump P is driven. Thereby, a first mixed solution, the third reagent solution, and the fourth reagent solution are circulated and mixed in the first circulation flow path 310, and a second mixed solution is obtained. Thereby, the magnetic particles (carrier particles) bind to the nucleic acid (sample material) included in the first mixed solution, and a complex of the sample material and the carrier particles is produced. In other words, this step can be referred to as a step in which, in the second continuous circulation flow path S2, the solutions in both circulation flow paths (that is, the second circulation flow path) of the first circulation flow path 310 and the fourth circulation flow path 340 are mixed, and the second mixed solution is obtained.

Further, after the binding between the nucleic acid and the magnetic particles is sufficiently advanced, a magnet that captures the magnetic particles in the capture portion 304 is brought close to the flow path while the second mixed solution is circulated in the second circulation flow path 320. Thereby, the capture portion 304 captures the complex of the sample material and the carrier particles. The complex of the sample material and the carrier particles is captured on an inner wall surface of the flow path of the capture portion 304.

Next, although this step is omitted from the illustration, the valves V1 and V6 are closed, the valve G1 of the air flow path 361 is opened, and the valve O4 of the discharge flow path 354 is opened. Further, by performing negative pressure suction through the outlet 71a of the waste solution tank 71, the liquid component (waste solution) separated from the complex is discharged from the second circulation flow path 320 to the waste solution tank 371. Thereby, the second mixed solution is removed from the flow path (overlapping shared flow path 302) shared by the second continuous circulation flow path S2 and the third circulation flow path 330, and the complex of the sample material and carrier particles captured by the capture portion 304 is separated from the liquid component.

Next, after the valves V6 and V7 are closed to make the first circulation flow path 310 to be a continuous closed loop, a cleaning solution is introduced from the introduction flow path 343 or the introduction flow path 345, and the first circulation flow path 310 is filled with the cleaning solution. Further, by driving the pump P, the cleaning solution is circulated in the first circulation flow path 310, the complex of the nucleic acid and magnetic particles captured by the capture portion 304 is cleaned. Further, after the circulation of the cleaning solution for a predetermined period of time is completed, the cleaning solution is discharged to the waste solution tank 370.

The cycle of introduction, circulation and discharge of the cleaning solution may be performed multiple times. By repeating the introduction, circulation and discharge of the cleaning solution, it is possible to enhance the removal efficiency of unnecessary materials.

The present embodiment is described using an example in which the cleaning solution is circulated in the first circulation flow path 310; however, the cleaning solution may be circulated in the second circulation flow path 320, and cleaning may be performed.

Next, after the shared flow path end valves V4 and V5 are closed and the shared flow path end valves V9 and V10 are opened to make the third circulation flow path 330 to be a continuous loop, a fifth reagent solution (detection solution) containing an eluate and a marker material (detection assisting material) is introduced from the introduction flow path 348, and the third circulation flow path 330 is filled with the fifth reagent solution.

In the present embodiment, the eluate contained in the fifth reagent solution is, for example, water. As described above, the silica magnetic particles bind to the nucleic acid in alcohol but does not bind to the nucleic acid in water.

Accordingly, by immersing the nucleic acid bound to the magnetic particles in water, the nucleic acid can be eluted from the magnetic particles. Further, the fifth reagent solution includes the marker material that binds to the nucleic acid (sample material) and that assists with the detection in the detection portion. The fifth reagent solution may be a solution suitable for storage of nucleic acid.

Next, the fifth reagent solution is circulated in the third circulation flow path 330 by driving the pump P in a state where the complex of the nucleic acid and the magnetic particles is released or is not released in the capture portion 304. Thereby, the nucleic acid is eluted from the complex of the nucleic acid and the magnetic particles, the marker material binds to the nucleic acid, and a complex of the sample material and the marker material is produced. When the complex of the nucleic acid and the magnetic particles is released from the capture portion 304 and circulated, by starting the capturing by the capture portion 304 again as a next step, the magnetic particles are captured again. Thereby, the magnetic particles can be removed from the liquid, and a state can be obtained in which only the nucleic acid bound to the marker material remains in the solution.

Through the above steps, the nucleic acid can be purified. When pure water that does not contain the marker material is used for the fifth reagent solution, a solution containing only nucleic acid in water can be purified. In this case, the purified solution can be recovered from the discharge flow path (recovery flow path) 356.

Next, by detecting the marker material in the detection portion 303A, the nucleic acid bound to the marker material is indirectly detected. When an enzyme is used as the marker material, the detection portion 303A can detect the nucleic acid by detecting a reaction product such as a dye, fluorescence, or the like created by the reaction with the substrate using the detection portion 3.

By following the procedure described above, it is possible to detect the sample material using the fluidic device 400.

According to the fluidic device 400 of the present embodiment, even in a configuration in which since the two continuous circulation flow paths S1 and S2 circulate a solution in the order of the second continuous circulation flow path S2 and the first continuous circulation flow path S1, and the circulation flow path (the second circulation flow path 320) after the former continuous circulation flow path (the second continuous circulation flow path S2) is used also as the circulation flow path ahead of the latter continuous circulation flow path (the first continuous circulation flow path S1), the sample material is moved sequentially in three or more of a plurality of circulation flow paths (the first circulation flow path 310, the second circulation flow path 320, and the third circulation flow path 330), and pretreatment and purification or detection are continuously performed in the flow paths, the configuration includes the reservoir formed in a length and a cross-sectional area that satisfy Expression (10), and therefore, it is possible to achieve the advantages according to the first to third embodiments described above.

DESCRIPTION OF THE REFERENCE SYMBOLS 1, 200, 300, 400 . . . Fluidic device
4 . . . First capture portion (capture portion)
5 . . . Assisting material detection portion
6 . . . Upper plate (second substrate)
8 . . . Lower plate (third substrate)
9, 201 . . . Substrate
9a, 201a . . . Lower surface (second surface)
9b, 201b . . . Upper surface (first surface)
10 . . . First circulation flow path (circulation flow path)
10a, 10b, 10c, 10d, 10e, 50a, 50b . . . Solution introduction inlet (penetration portion)
11 . . . Flow path
19A, 119A . . . Reservoir layer
19B, 119B . . . Reaction layer
29, 29A, 29B, 29C . . . Reservoir
38 . . . Penetration hole (first penetration hole)

29A1, 29B1, 29C1, 213R1 . . . First straight portion (first flow path)
29A2, 29B2, 29C2, 213R2 . . . Second straight portion (second flow path)
29D1 . . . First flow path
29D2 . . . Second flow path
38D, 38E . . . Penetration hole (first penetration hole)
39, 39D, 39E . . . Supply hole (second penetration hole)
39A, 39B, 39C . . . Penetration portion (penetration flow path)
40, 42 . . . Capture portion
50 . . . Second circulation flow path (circulation flow path)
60 . . . Detour flow path
61 . . . Meandering flow path
202 . . . Shared flow path
210 . . . First circulation flow path
220 . . . Second circulation flow path
212R, 213R, 214R, 215R, 222R, 224R, 225R . . . Reservoir
304 . . . Capture portion
310 . . . First circulation flow path
320 . . . Second circulation flow path
330 . . . Third circulation flow path
340 . . . Fourth circulation flow path
L8, S . . . Solution
S1 . . . First continuous circulation flow path (first type continuous circulation flow path)
S2 . . . Second continuous circulation flow path (second type continuous circulation flow path)

The invention claimed is:

1. A fluidic device comprising: a reservoir that accommodates a solution; and an introduction flow path into which the solution is introduced from the reservoir,
wherein the reservoir comprises:
a meandering flow path; and
a supply hole that is provided on one end of the meandering flow path and that supplies the solution from the meandering flow path to the introduction flow path,
the meandering flow path includes:
a plurality of first flow paths that extend linearly along a first direction and that are arranged to be spaced from each other; and
a second flow path that extends linearly along a second direction that is different from the first direction, that is connected to one first flow path at one end of the one first flow path, and that is connected to another first flow path at one end of the other first flow path, the meandering flow path being a flow path in which the solution flows along the second direction, and
wherein, when a surface tension of the solution is $\gamma$ (N/m), a density of the solution is $\rho$ (kg/m$^3$), an acceleration which includes a gravity and which is applied to the solution is G (m/s$^2$), a wetted perimeter length of the first flow path and the second flow path is Wp (m), a cross-sectional area of the first flow path and the second flow path is A (m$^2$), a receding contact angle is $\alpha$ (°), and an advancing contact angle is $\beta$ (°),
both a length of the first flow path and a length of the second flow path in the meandering flow path is equal to or less than $(\gamma \times Wp \times (\cos \alpha - \cos \beta))/(\rho \times A \times G)$.

2. The fluidic device according to claim 1,
wherein a cross-sectional area of the meandering flow path is formed in a size according to a capillary length that is calculated according to the density and the surface tension of the solution and acceleration which includes a gravity and which is applied to the solution.

3. The fluidic device according to claim 1,
wherein with respect to a cross-sectional area of the meandering flow path, a radius of an inscribed circle of the reservoir is smaller than the capillary length.

4. The fluidic device according to claim 1,
wherein the first flow paths and the second flow path are linearly formed.

5. The fluidic device according to claim 1,
wherein the first direction and the second direction are directions perpendicular to each other.

6. The fluidic device according to claim 1, comprising
a substrate having one surface on which the reservoir is formed in a direction parallel to the one surface of the substrate and having the introduction flow path formed on an opposite side of the one surface.

7. The fluidic device according to claim 1, comprising:
a first substrate having a first surface on which the introduction flow path is formed; and
a second substrate that is stacked on and joined to the substrate such that the second substrate faces the first surface;
wherein the reservoir is formed on a second surface on an opposite side of the first surface of the first substrate or on the second substrate, and
at least part of the introduction flow path and at least part of the reservoir overlap each other when seen in a direction in which the first substrate and the second substrate are stacked.

8. The fluidic device according to claim 7, comprising
a second flow path that connects the flow path to the reservoir and that is disposed in a part in which the at least part of the flow path and the at least part of the reservoir overlap each other when seen in the direction in which the first substrate and the second substrate are stacked.

9. The fluidic device according to claim 1, comprising:
a valve that is disposed in at least part of the introduction flow path and that is configured to adjust a flow rate of the solution in the introduction flow path,
wherein the valve is arranged such that each of at least two flow paths partitioned by the valve has a predetermined volume.

10. The fluidic device according to claim 1,
wherein the reservoir comprises:
a first reservoir in which a first solution is accommodated and which is configured to supply the first solution to the flow path; and
a second reservoir in which a second solution is accommodated and which is configured to supply the second solution to the flow path.

11. The fluidic device according to claim 1,
wherein the introduction flow path is connected to a circulation flow path that is configured to circulate a solution including a sample material,
the circulation flow path includes two or more quantitation valves, and each of the quantitation valves are arranged such that each of sections of the circulation flow path partitioned by the quantitation valve has a predetermined volume,
the introduction flow path is connected to all circulation flow paths partitioned by the quantitation valve, and
the reservoir is connected to the introduction flow path.

12. The fluidic device according to claim 11,
wherein at least one of a capture portion that is configured to capture the sample material and a detection portion that is configured to detect the sample material is disposed in the circulation flow path.

13. The fluidic device according to claim 12,
wherein the circulation flow path comprises a first circulation flow path and a second circulation flow path that share at least part of the flow path, and
the shared flow path includes at least one selected from a group consisting of a capture portion that is configured to capture the sample material, a detection portion that is configured to detect the sample material, a valve, and a pump.

14. The fluidic device according to claim 12,
wherein the circulation flow path includes at least two continuous circulation flow paths selected from a group consisting of:
a first type continuous circulation flow path which is formed of a first circulation flow path and a second circulation flow path and which is configured to circulate a solution in the first circulation flow path and then circulate the solution in the second circulation flow path; and
a second type continuous circulation flow path which is formed of a third circulation flow path and a fourth circulation flow path and which is configured to circulate a solution in the third circulation flow path and then circulate and mix the solution in both of the third and fourth circulation flow paths, and
any of the circulation flow paths includes at least one of a capture portion that is configured to capture a sample material and a detection portion that is configured to detect a sample material.

15. The fluidic device according to claim 1,
wherein the plurality of first flow paths are flow paths having the same length and are arranged in parallel with each other.

16. The fluidic device according to claim 1,
wherein the reservoir further comprises
an injection hole which is provided on one end on an opposite side of the supply hole of the meandering flow path and through which the solution is injected, and
a bubble is included at the injection hole side of the meandering flow path, and the solution is accommodated at the supply hole side.

17. A fluidic device comprising: a reservoir that accommodates a solution; and an introduction flow path into which the solution is introduced from the reservoir,
wherein the reservoir is formed in a direction parallel to one surface of a substrate,
the reservoir comprises:
a first penetration hole that penetrates through the substrate in a thickness direction perpendicular to the one surface;
a second penetration hole that penetrates through the substrate in the thickness direction perpendicular to the one surface at a position different from the first penetration hole; and
a detour flow path that is formed in a flow path length longer than a distance between the first penetration hole and the second penetration hole, the detour flow path detouring and connecting together the first penetration hole and the second penetration hole, and
when a surface tension is $\gamma$ (N/m), a density of the solution is $\rho$ (kg/m$^3$), an acceleration which includes a gravity and which is applied to the solution is G (m/s$^2$), a wetted perimeter length of the detour flow path is Wp (m), a cross-sectional area of the detour flow path is A (m$^2$), a receding contact angle is $\alpha$ (°), and an advancing contact angle is $\beta$ (°),
a distance between an interface on the first penetration hole side and an interface on the second penetration hole side of the solution accommodated in the reservoir is equal to or less than $(\gamma \times Wp \times (\cos \alpha - \cos \beta))/(\rho \times A \times G)$.

18. The fluidic device according to claim 17,
wherein the detour flow path comprises a meandering flow path
which includes:
a plurality of first flow paths that extend linearly along a first direction and that are arranged to be spaced from each other; and
a second flow path that extends linearly along a second direction that is different from the first direction, that is connected to one first flow path at one end of the one first flow path, and that is connected to another first flow path at one end of the other first flow path, and
in which the solution flows along the second direction.

19. The fluidic device according to claim 18,
wherein a cross-sectional area of the detour flow path is formed in a size according to a capillary length that is calculated according to the density and the surface tension of the solution and acceleration which includes a gravity and which is applied to the solution.

20. The fluidic device according to claim 19,
wherein with respect to a cross-sectional area of the detour flow path, a radius of an inscribed circle of the reservoir is smaller than the capillary length.

* * * * *